US006630681B1

United States Patent
Kojima

(10) Patent No.: US 6,630,681 B1
(45) Date of Patent: Oct. 7, 2003

(54) CHARGED-PARTICLE-BEAM MICROLITHOGRAPHY APPARATUS AND METHODS INCLUDING CORRECTION OF ABERRATIONS CAUSED BY SPACE-CHARGE EFFECTS

(75) Inventor: Shinichi Kojima, Wappingers Falls, NY (US)

(73) Assignee: Nikon Corporation, Tokyo (JP)

( * ) Notice: Subject to any disclaimer, the term of this patent is extended or adjusted under 35 U.S.C. 154(b) by 338 days.

(21) Appl. No.: 09/620,760

(22) Filed: Jul. 21, 2000

(30) Foreign Application Priority Data

Jul. 21, 1999 (JP) .............................. 11-206796

(51) Int. Cl.[7] .............................. G21K 5/10; H01J 37/08
(52) U.S. Cl. .................... 250/492.22; 250/282; 430/30; 430/942; 313/389
(58) Field of Search .................... 250/492.2; 430/30, 430/942; 313/389

(56) References Cited

U.S. PATENT DOCUMENTS

| 3,934,171 | A | * | 1/1976 | Hutter et al. | 315/30 |
|---|---|---|---|---|---|
| 4,427,917 | A | * | 1/1984 | Mizushima et al. | 313/389 |
| 5,008,553 | A | | 4/1991 | Abe | 250/492.2 |
| 5,834,783 | A | * | 11/1998 | Muraki et al. | 250/398 |
| 5,905,267 | A | | 5/1999 | Muraki | 250/492.22 |
| 5,973,332 | A | * | 10/1999 | Muraki et al. | 250/492.2 |
| 6,087,669 | A | | 7/2000 | Suzuki | 250/492.23 |
| 6,166,387 | A | * | 12/2000 | Muraki et al. | 250/492.2 |
| 6,323,499 | B1 | * | 11/2001 | Muraki et al. | 250/492.22 |
| 6,337,164 | B1 | * | 1/2002 | Nakasuji | 430/30 |

OTHER PUBLICATIONS

Tang et al., "Modeling and Design of Space Charge Lenses/Aberration Correctors for Focused Ion Beam Systems," *J. Vac. Sci. Technol.* 14:80–84 (1996).

* cited by examiner

Primary Examiner—John R. Lee
Assistant Examiner—Erin-Michael Gill
(74) Attorney, Agent, or Firm—Klarquist Sparkman LLP

(57) ABSTRACT

Apparatus and methods are disclosed for reducing aberrations caused by space-charged effects in charged-particle-beam (CPB) microlithography. A representative CPB microlithography apparatus includes illumination-optical and projection-optical systems and a beam-correction-optical system. The beam-correction-optical system is connected to a control computer configured to compute correction data for correcting a space-charge-effect (SCE)-based aberration. The correction data are calculated from the distribution of pattern elements in the exposure region, the illumination-beam current, the spread-angle distribution of the illumination beam, the beam-accelerating voltage of the illumination beam, the axial distance between the reticle and substrate, and optical characteristics of the projection-optical system.

44 Claims, 13 Drawing Sheets

Input data on magnetic and electric fields
(lens, deflector, and correction fields)
Input Parameters
(Beam-acceleration voltage $\phi$, Pattern-element distribution $P_a(x,y)$ in exposure region; illumination-beam current, spread-angle distribution, axial distance from reticle to substrate, optical characteristics of projection-optical system)

Compute charged-particle trajectory $(w(z) = w_x(z) + i*w_y(z))$ $$w''(z) + \frac{\tau'(z)}{2\tau(z)}w'(z) + \frac{\tau''(z)}{4\tau(z)}w(z) - i\sqrt{\frac{\eta}{2\tau(z)}}\left(B(z)w'(z) + \frac{1}{2}B'(z)w(z)\right) = 0$$

Compute space-charge distribution of beam $$\rho(x, y, z) = k*(1/r_b(z))^2 * \left(\iint A(X, Y, z)dXdY\right)^{-1}$$
$$* \iint P_a((x_1*\cos\theta_b(z) + y_1*\sin\theta_b(z))/r_b(z), (y_1*\cos\theta_b(z) - x_1*\sin\theta_b(z))/r_b(z))$$
$$*A(x-x_1, y-y_1, z)dx_1dy_1$$

Compute electrostatic potential $$\Phi(x, y, z) = \frac{1}{4\pi\varepsilon_0}\iiint \frac{\rho(x_1, y_1, z_1)}{\sqrt{(x-x_1)^2 + (y-y_1)^2 + (z-z_1)^2}} dx_1,dy_1,dz_1$$

Compute change in beam trajectory $\delta w(z)$

Compute correction
(rotation, magnification, focus, astigmatism, anisotropic magnification, and amounts of deflection-position correction)

FIG. 9

CHARGED-PARTICLE-BEAM MICROLITHOGRAPHY APPARATUS AND METHODS INCLUDING CORRECTION OF ABERRATIONS CAUSED BY SPACE-CHARGE EFFECTS

FIELD OF THE INVENTION

The present invention relates to microlithography, which is a key technology used in the manufacture of semiconductor integrated circuits, displays, and the like. More specifically, the invention pertains to microlithography performed using a charged particle beam (e.g., electron beam or ion beam) as an energy beam.

BACKGROUND OF THE INVENTION

Conventional apparatus for performing charged-particle-beam (CPB) microlithography are represented by various electron-beam microlithography systems such as Gaussian spot-beam systems, variable-shaped beam systems, cell projection-exposure systems, and shaped-beam exposure systems. In many of these systems, the maximum field size that can be exposed is relatively small, on the order of 10 $\mu$m square (on the substrate) per exposure. More recent divided-reticle electron-beam microlithography systems have been developed that can expose a pattern divided into square sections ("subfields") as large as 250 $\mu$m square on the substrate, wherein the various subfields are exposed individually in a sequential manner. Current research also is directed to the development of ion-beam microlithography systems that can expose even larger regions per "shot."

One technical challenge to exposing larger regions per shot is adequate control of the Coulomb effect. The Coulomb effect is manifest as image blur due to Coulomb interactions (repulsion) between individual charged particles in the charged particle beam that causes the particles to scatter. Adequately controlling the Coulomb effect allows higher resolution exposures to be made with minimal blurring, even when using a higher illumination-beam current than in prior systems.

Unfortunately, exposing a larger region typically is accompanied by a more prominent space-charge effect (in which the charge distribution created by the charged particle beam produces its own lens action). The space-charge effect is especially important when using CPB microlithography to fabricate semiconductor devices having a minimum linewidth of 0.1 $\mu$m or less. In such applications, a failure to correct aberrations due to the space-charge effect can seriously degrade the performance of the semiconductor devices produced.

Changing the beam current can change image magnification and focus due to the space-charge effect. The degree of image defocus (referred to as "Coulomb defocus") varies with certain parameters such as pattern-element density. Coulomb defocus of a particular image can be corrected by repositioning the focal point of the beam. However, in divided-reticle microlithographic exposure, a large number of subfields are exposed to transfer an entire pattern. Each subfield typically has a different distribution of pattern elements. Consequently, the need to perform focus and magnification alignment for each respective subfield constitutes a major problem. For CPB microlithography systems, the ability to predict and correct, accurately and rapidly, changes in the image due to the space-charge effect is a critical requirement for a practical high-resolution CPB microlithography system.

One system proposed as a solution to this problem is disclosed in U.S. Pat. No. 6,087,669. This system corrects changes in image magnification, rotation, astigmatism, and distortion due to the space-charge effect as caused by changes in beam current and by differences in the distribution of pattern elements from subfield to subfield. However, this device falls short of achieving more accurate exposures due to its inability to make more accurate corrections of aberrations arising from the space-charge effect.

Conventionally, little consideration is given to converting integrated-circuit design data into exposure-correction data useful for correcting aberrations due to the space-charge effect. There also is a marked lack of contemporary knowledge of how to go about computing data for making accurate corrections of the space-charge effect in microlithography systems such as divided-reticle systems in which the distribution of pattern elements differs from one subfield to the next.

SUMMARY OF THE INVENTION

In view of the shortcomings of the prior art as summarized above, an object of the invention is to provide charged-particle-beam (CPB) microlithography apparatus, methods, data-conversion methods, reticles, and semiconductor-device manufacturing methods in which high-resolution exposures are obtained, especially exposures in which aberrations caused by space-charge effects are reduced substantially.

To such ends, and according to a first aspect of the invention, CPB microlithography apparatus are provided for transferring a pattern, defined on a reticle segmented into multiple exposure regions, onto a sensitive substrate. An embodiment of such an apparatus comprises an illumination-optical system, a projection-optical system, a beam-correction-optical system, and a control computer. The illumination-optical system is situated and configured to direct a charged-particle illumination beam from a source to a selected exposure region on the reticle. The projection-optical system is situated and configured to direct a charged-particle patterned beam, formed by passage of a portion of the illumination beam through the exposure region, from the exposure region onto the sensitive substrate, so as to form a transfer image of the exposure region on a selected corresponding region of the substrate. The beam-correction-optical system is situated and configured to correct the transfer image based on correction data for correcting a space-charge-effect (SCE)-based aberration. The beam-correction-optical system also can correct conventional aberrations, e.g., image-field-curvature, and astigmatism, based on conventional methods. The control computer is connected to the beam-correction-optical system and is configured to control the beam-correction-optical system from the following types of input data: (a) the distribution of pattern elements in the exposure region, (b) the illumination-beam current, (c) the spread-angle distribution of the illumination beam, (d) the beam-accelerating voltage to which the illumination beam is subjected, (e) the axial distance between the reticle and the sensitive substrate, and (f) optical characteristics of the projection-optical system. A processor (or multiple respective processors) normally is used to calculate correction data from the input data. The processor (s) can be integrated into the CPB microlithography apparatus or, alternatively, provided separately from the CPB microlithography apparatus, wherein only the calculated correction data (from the processors) are input into the CPB microlithography apparatus. I.e., the processors(s) or software controlling them can be provided separately as separate products from the CPB microlithography apparatus itself.

The exposure regions on the reticle can be in the form of subfields each defining a respective portion of the pattern, wherein each exposure region is substantially coextensive with a respective subfield. In such a configuration, the control computer is configured to cause the illumination beam to illuminate the subfields sequentially and to cause the patterned beam to transfer images of the respective pattern portions defined within the subfields to the sensitive substrate in sequence.

Alternatively, the exposure regions on the reticle can be in the form of deflection fields each defining a respective portion of the pattern. In such a configuration, the control computer is configured to cause the illumination beam to scan the deflection fields sequentially and to cause the patterned beam to transfer images of the respective pattern portions defined within the deflection fields to the sensitive substrate in sequence.

The beam-correction-optical system desirably is configured to correct at least one of rotation, magnification, focal point, astigmatism, anisotropic magnification, orthogonality, and position of the transfer image. Further desirably, the beam-correction-optical system corrects more than one of these characteristics. To such ends, the beam-correction-optical system desirably comprises at least three focus-correction lenses, at least two stigmators, and at least one deflector. Such a configuration allows independent correction of parameters selected from image rotation, image magnification, image focal point, image astigmatism, image anisotropic magnification, image orthogonality, and image position. The focus-correction lenses desirably are used to correcting focus, rotation, and magnification of the image. Each of the stigmators desirably has a multi-pole configuration. The stigmators are used for correcting astigmatism, orthogonality, and anisotropic magnification of the image. The deflectors desirably are used for adjusting the position of the image on the sensitive substrate. The use of a combination of three focus-correction lenses enables rotation, magnification, and focus of the image to be adjusted simultaneously as desired. The combination of at least two stigmators enables variations in astigmatism, orthogonality, and anisotropic magnification to be corrected simultaneously as desired. Hence, multiple corrections can be made at the same time, even when the noted aberrations occur in arbitrary ratios (relative to each other) depending upon the SCE-related parameters such as distribution of pattern-element openings within the transfer subfield, illumination-beam current, illumination-beam spread-angle distribution, illumination-beam acceleration voltage, axial distance between the reticle and substrate, and optical characteristics of the projection-optical system.

With respect to the focus-correction lenses, all can be electromagnetic, two can be electromagnetic and one electrostatic, or one can be electromagnetic and two electrostatic. With respect to the stigmators, both can be electromagnetic or electrostatic, or one can be electrostatic and the other electromagnetic. These combinations can be changed as appropriate for use with electromagnetic deflectors or electrostatic deflectors.

The apparatus desirably further comprises a memory situated and configured to store the correction data. The control computer recalls the correction data as required for routing to a drive system connected to the beam-correction-optical system. Thus, the beam-correction-optical system is driven (actuated) according to the recalled correction data. Including a memory for storing correction data allows rapid correction of SCE-based aberrations.

According to another aspect of the invention, methods are provided for performing CPB microlithography in which an exposure region on a divided reticle is illuminated by an illumination beam, and a patterned beam propagating downstream of the illuminated region is imaged by a projection-optical system onto a surface of a sensitive substrate. The subject methods include a method for correcting a space-charge-effect (SCE)-based aberration arising while transferring an image of the illuminated region onto the substrate surface. In the correcting method, a calibration pattern is used. An expected SCE-based aberration is computed that is expected to occur if the image of the calibration pattern were transferred to the sensitive substrate. The calibration pattern is illuminated with the illumination beam so as to form an image of the calibration pattern on the sensitive substrate. An actual SCE-based aberration exhibited by the transferred image of the calibration pattern is measured. From the measured SCE-based aberration, a correction coefficient is computed for correcting a difference between the expected SCE-based aberration and the actual SCE-based aberration of the transferred image of the calibration pattern. Correction data are determined for correcting an SCE-based aberration of a transferred image of an exposure region of the reticle. The correction data are calibrated according to the correction coefficient. Based on the calibrated correction data, a transfer image is corrected and projected onto the sensitive substrate.

In the foregoing method, the step of measuring an actual SCE-based aberration desirably comprises at least one of: (a) producing an electrical signal from projecting the calibration pattern onto a detection mark provided on the sensitive substrate or on a substrate stage, and analyzing the signal with respect to one or more representative points of the calibration pattern; and (b) developing the image of the calibration pattern on the substrate, and measuring the image using a measuring instrument.

Further with respect to the foregoing method, the step of computing an expected SCE-based aberration can be performed based on the following parameters: the distribution of pattern elements within the calibration pattern, the beam current of the illumination beam, the spread-angle distribution of the illumination beam, the accelerating voltage of the illumination beam, the axial distance from the reticle to the substrate, and the optical characteristics of the projection-optical system. The computed expected SCE-based aberration and the measured SCE-based aberration desirably comprises at least one of: image rotation, image magnification, image focal point, image astigmatism, image anisotropic magnification, image orthogonality, and positional displacement of the image.

According to another aspect of the invention, data-conversion methods are provided. The data-conversion methods are especially applicable to methods for performing CPB microlithography in which an exposure region on a divided reticle is illuminated by an illumination beam passing through an illumination-optical system. A patterned beam propagating downstream of the illuminated exposure region through a projection-optical system is imaged on a surface of a sensitive substrate. The data-conversion method is applied to converting data used for computing an amount of correction of an SCE-based aberration in an image of the exposure region on the sensitive substrate. In an embodiment of the data-conversion method, the SCE-based aberration is computed from data concerning: the distribution of pattern elements within the exposure region, the illumination-beam current with which the exposure region is illuminated, the spread-angle distribution of the illumination beam, the accelerating voltage of the illumination beam, the axial distance from the reticle to the sensitive substrate, and optical characteristics of the projection-optical system. Aberration-correction data are produced from the computed SCE-based aberration.

The step of computing the SCE-based aberration can be performed by: (a) computing a distribution of space-charge created by the patterned beam propagating between the reticle and the sensitive substrate, (b) computing the electrostatic potential created by the distribution of space-charge, and (c) re-computing the trajectory of at least one of the illumination and patterned beams, or computing the displacement of the trajectory of at least one of the patterned beams, based on the computed electrostatic potential. The step of computing the distribution of space-charge can comprise the steps of: (1) expressing a spread-angle distribution of the illumination beam as a function $A(x,y,z)$, wherein z is a parameter corresponding to a position on the optical axis of the illumination- and projection-optical systems, and x and y are respective parameters corresponding to respective positions in an xy plane perpendicular to the optical axis; (2) defining a convolution integral of the spread-angle distribution $A(x,y,z)$ and a distribution $P_a(x,y)$ of pattern elements within the exposure region; and (3) computing discrete values of the space-charge according to the convolution integral, wherein corresponding values of the spread-angle distribution $A(x,y,z)$ are recalled from a look-up table previously stored in a memory, wherein the table contains definite integrals of the x and y parameters of the spread-angle distribution $A(x,y,z)$. The step of computing the distribution of space-charge can comprise computing a near-axis trajectory of the patterned beam passing through the projection-optical system.

A representative calculation for determining the density distribution of space-charge $\rho(x,y,z)$ of an arbitrary point $(x,y,z)$ in the charged particle beam is as follows:

$$\rho(x, y, z) = k*(1/r_b(z))^2$$
$$*(\int\int A(X, Y, z)dXdY)^{-1}*\int\int P_a$$
$$((x_1*\cos \theta_b(z)+y_1$$
$$*\sin \theta_b(z))/r_b(z), (y_1$$
$$*\cos \theta_b(z)-x_1*\sin \theta_b$$
$$(z))/r_b(z))*A$$
$$(x-x_1, y-y_1, z)dx_1dy_1$$

wherein $r_a(z)$, $r_b(z)$, $\theta_a(z)$, and $\theta_b(z)$ are the radial and rotational components of representative trajectories $W_a$ and $W_b$, and k is the illumination-beam charge density immediately upstream of the reticle. Hence, the charge density $\rho(x,y,z)$ is the convolution integral of the spread-angle distribution $A(x,y,z)$ of the illumination beam and the pattern-element distribution $P_a(x,y)$.

Further with respect to the data-conversion method, the distribution of space-charge can be computed by: (a) dividing the exposure region into sub-subfields; (b) quantifying one or more characteristics of the pattern elements existing within a sub-subfield; (c) configuring simplified graphic figures having characteristics corresponding to the quantified characteristics of the pattern elements; and (d) computing the distribution of space-charge based on the simplified graphic figures. The characteristics of the pattern elements include at least one of: (i) the area of all pattern elements within a sub-subfield, and (ii) the centroid of all pattern elements within the sub-subfield. The area and centroid of pattern elements existing within the sub-subfield desirably are calculated as follows:

$$\text{Area} = \Sigma S_j$$
$$\text{Centroid}_x = (\Sigma G_{xj} S_j)/(\Sigma S_j)$$
$$\text{Centroid}_y = (\Sigma G_{yj} S_j)/(\Sigma S_j)$$

wherein the summations ($\Sigma$) are made over all pattern elements existing within the sub-subfield, $S_j$ is an area of a pattern element j existing within the sub-subfield, j is an integer equal to the number of pattern elements, and $G_{xj}$ and $G_{yj}$ are x and y coordinates, respectively, of a location of the centroid of the pattern element (j) in a plane of the pattern.

The step of computing the SCE-based aberration can be performed as follows. A first-order approximation of the SCE-based aberration in the image of the exposure region is computed by: (1) computing the electrostatic potential created by the distribution of space-charge, based on a computation of the near-axis trajectory of the patterned beam passing through the projection-optical system; and (2) recomputing the trajectory of the patterned beam based on the computed electrostatic potential. A second-order approximation of the SCE-based aberration in the image of the exposure region is computed by: (1) using the re-computed trajectory of the beam, recomputing the distribution of space-charge created by the patterned beam propagating between the reticle and substrate; (2) computing the electrostatic potential created by the recomputed distribution of space-charge; and (3) recomputing the trajectory of the patterned beam based on the computed electrostatic potential. These steps are repeated as required until a difference between the computed first- and second-order approximations is within a prescribed tolerance.

In executing the data-conversion method summarized above, calculation of the SCE-based aberration can be performed using a computer system comprising multiple processors. Each processor performs the computation of an SCE-based aberration for a different respective exposure region. The computations performed by the processors are performed in parallel.

The aberration-correction data desirably comprise a numerical value for at least one of the following: image rotation, image magnification, image focal point, image astigmatism, image anisotropic magnification, image orthogonality, and positional displacement of the image. Furthermore, the aberration-correction data desirably include one or more of the following: (i) data used for controlling actuation of a CPB-correction-optical system so as to correct the SCE-based aberration, and (ii) data used for altering a position and/or shape of a pattern element defined by the reticle in a manner serving to cancel the SCE-based aberration when the pattern element is imaged onto the substrate. The data used for altering a position and/or shape of a pattern element defined by the reticle can comprise data for canceling at least one SCE-based aberration selected from the following: image rotation, image magnification, image orthogonality, image anisotropic magnification, image position displacement, and higher-order distortion of the image.

According to another aspect of the invention, CPB microlithography apparatus are provided that include a projection-optical system situated and configured to direct a patterned beam from a reticle to a substrate. An embodiment of the apparatus also includes a CPB-correction-optical system and a control computer connected to the CPB-correction-optical system. The control computer is configured to drive the CPB-correction-optical system based on data, to be used by the CPB-correction-optical system, produced by a data-conversion method according to the invention.

The foregoing and additional features and advantages of the invention will be more readily apparent from the following detailed description, which proceeds with reference to the accompanying drawings.

BRIEF DESCRIPTION OF THE DRAWINGS

FIG. 1(*c*) is a plan view of a portion of a pattern to be divided into four rectangular deflection fields, and FIG. 1(*d*) is a plan view of a corresponding portion of a reticle divided into the four deflection fields.

FIG. 4(*g*) is a plan view of corresponding marks, comprising equally spaced heavy-metal linear features, and intended to be used with a calibration pattern as shown in any of FIGS. 4(*a*)–4(*f*), that would be provided on a substrate or substrate stage.

FIG. 8(*b*) schematically depicts the substitution, for each group of pattern elements in FIG. 8(*a*), of a square having a respective area and centroid corresponding to the respective group of pattern elements.

FIG. 9 is a flowchart of a method, according to the invention, for determining a correction to an SCE-based aberration based on a near-axis trajectory approach. Representative equations used in the calculations are included.

DETAILED DESCRIPTION

General Considerations

Figure 1A:
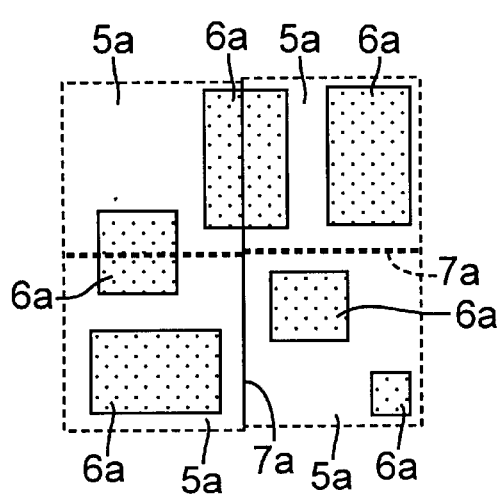
FIG. 1(*a*) is a plan view of a portion of a pattern to be divided into four square subfields, and FIG. 1(*b*) is a plan view of a corresponding portion of a reticle divided into the four subfields.
Figure 1B:
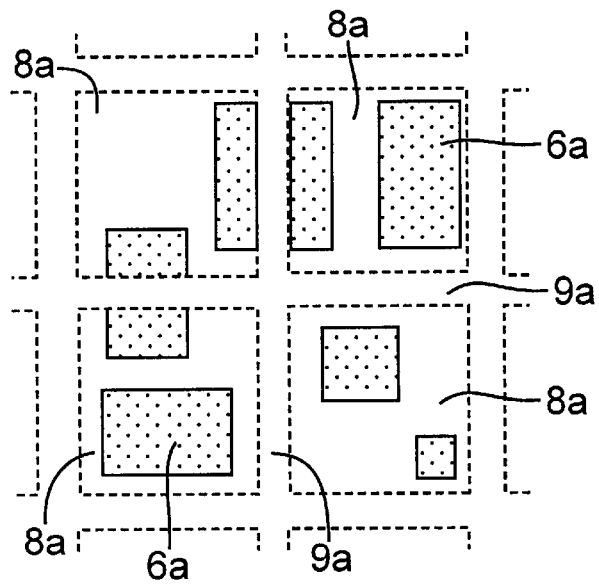
Figure 1C:
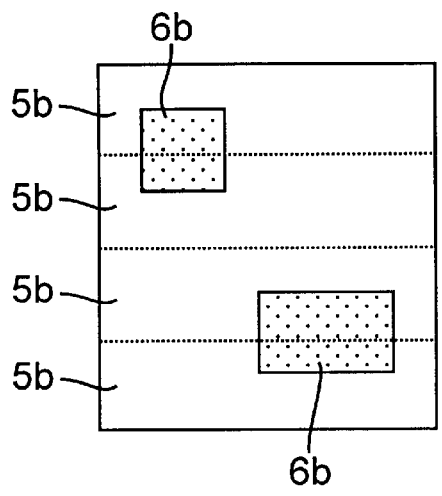
Figure 1D:
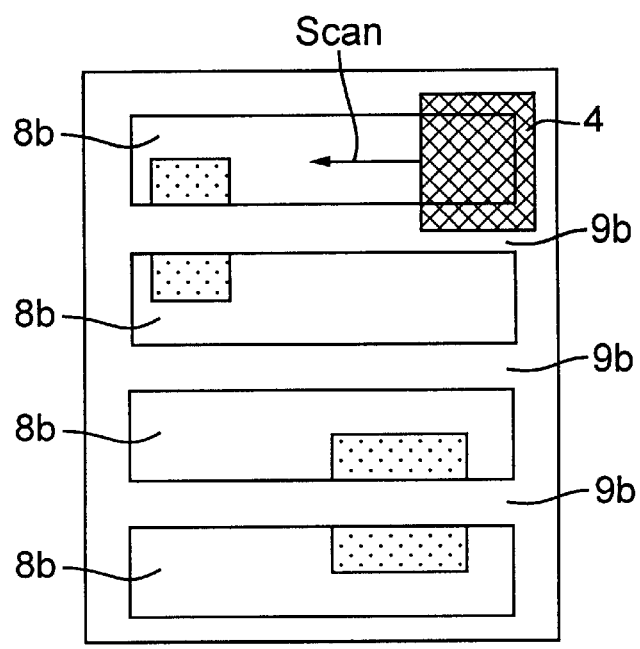

In divided-reticle charged-particle-beam (CPB) microlithography, as noted above, a charged particle beam is used as an energy beam for achieving projection-transfer of a pattern, defined by reticle, onto a suitable "sensitive" substrate such as a semiconductor wafer. (By "sensitive" is meant that the substrate is coated with a substance, such as a suitable resist, on which a latent image of the reticle pattern is imprintable.) The charged particle beam can be an electron beam or an ion beam. The reticle is divided or segmented into multiple subfields that are "illuminated" (irradiated) individually by an "illumination beam." For illumination, the reticle is mounted on a reticle stage. As the illumination beam passes through an illuminated subfield, the beam becomes "patterned" by the distribution and configuration of pattern elements in the illuminated subfield. Thus, the beam propagating downstream of the reticle is termed the "patterned beam." The patterned beam passes through projection lenses that collectively focus the patterned beam on a corresponding "transfer subfield" on the substrate. For imaging with the pattern, the substrate is mounted on a substrate stage. The transfer subfields are positioned such that, after all the subfields have been exposed, the corresponding transfer subfields are "stitched" together in a contiguous manner to form the complete pattern on the substrate. The CPB-optical system located upstream of the reticle and used for irradiating the subfields on the reticle is termed the "illumination-optical system," and the CPB-optical system located between the reticle and the substrate is termed the "projection-optical system."

FIGS. 1(*a*) and 1(*b*) depict examples in which the pattern to be transferred is divided on the reticle into multiple square subfields. Specifically, FIG. 1(*a*) shows a pattern region with lines 7*a* denoting division of the pattern portion into four portions 5*a*. Each of the depicted portions 5*a* contains at least one pattern element 6*a*. In dividing up the pattern, the dividing lines 7*a* can cross individual elements 6*a*. FIG. 1(*b*) shows the subfields 8*a*, corresponding to the portions 5*a*, as actually defined on the reticle separated from each other by boundary zones 9*a*. Although only four subfields 8*a* are shown in FIG. 1(*b*), it will be understood that an actual reticle typically comprises thousands of subfields 8*a* each defining a respective portion of the overall pattern. Each subfield 8*a* is illuminated individually, in a step-and-repeat manner, with the illumination beam to form, on the sensitive substrate, an image of the respective pattern portion.

The subfields on the reticle can have a profile other than square and can be illuminated in a scanning rather than step-and-repeat manner. For example, FIG. 1(*c*) shows an example in which the pattern is divided into multiple extended rectangular regions 5*b*, and FIG. 1(*d*) shows the subfields 8b, corresponding to the portions 5b, as actually defined on the reticle. The subfields 8b are separated from each other by boundary zones 9b. Again, for simplicity, only four regions 5b are shown, but it will be understood that the number of regions is not limited to four. Each corresponding subfield 8b on the reticle is illuminated by scanning. Specifically, at an instant in time, the illumination beam illuminates an illumination region 4. During scanning, the illumination region 4 moves continuously (uninterruptedly) over time along the length of the respective subfield 8b (note "scan" arrow). To effect such scanning, the illumination beam is deflected appropriately by a deflector located in the illumination-optical system. Thus, each subfield 8b represents a "deflection field" of the illumination-optical system.

During scanning of each deflection field 8b, numerical values of correction data can be calculated and/or updated continuously, allowing the focus correction, for example, to be adjusted continuously as required to correct for space-charge effects. However, because the computations for continuous updating would be enormous, and the correction process complex, it is desirable to compute scanning corrections at prescribed scan-distance intervals (e.g., every 500 μm on the reticle), and make appropriate corrections at each step. Corrections between steps can be made by interpolation.

In divided-reticle microlithography, the space-charge effect (abbreviated herein "SCE") arises from the following parameters:

(a) the distribution of pattern elements within a subfield or other region illuminated by the illumination beam;

(b) the beam current of the illumination beam as incident on the reticle;

(c) the distribution of beam-spread angle of the illumination beam as incident on the reticle;

(d) the beam-accelerating voltage of the illumination beam;

(e) the axial distance between the reticle and the substrate; and (f) the optical characteristics of the projection-optical system.

Relative differences in these parameters affect how the pattern image transferred by the charged particle beam is or will be affected by space-charge effects. Deviations from an ideal image due to space-charge effects are termed herein "SCE-based aberrations." The distribution of pattern elements in an illuminated subfield affects the beam current flowing through the subfield and the angle of incidence of the illumination beam in the illuminated subfield as the beam passes through the reticle. The illumination-beam current is the beam current illuminating the reticle. The distribution of the beam-spread angle is the distribution function of the spread angle of the illumination beam as incident on the reticle. The beam-accelerating voltage determines the velocity of the particles of the illumination beam as incident on the reticle. The axial distance between the reticle and the substrate is the axial distance over which charged particles of the patterned beam can interact with one another. The term "optical characteristics of the projection-optical system" encompasses parameters such as the relative positions and types of optical components in the projection-optical system, including, for example, characteristics that determine the geometric trajectory and velocity distribution of the patterned beam.

The geometric trajectory of the patterned beam can be changed by making any of various changes in the component lenses of the projection-optical system (e.g., a change in number of lenses or respective ampere-turns of the lenses). Changing any of these parameters also will change the distribution of space-charge created by the beam itself, thus changing the influence of the space-charge effect. These parameters also affect, for example, errors in optical-system positioning that arise during manufacturing of the optical system. Such errors are unique to a particular microlithography tool. Hence, a change in one or more of these parameters can be made to correct such errors.

For example inserting an electrostatic lens, for example, will change localized electric potentials and, consequently, the velocity of charged particles of the beam. The consequences of changes in the space-charge effect resulting from such beam-velocity changes must be accounted for.

Basically, the resulting influence of the space-charge effect can be reduced by reducing beam current, increasing the acceleration voltage (thereby increasing the beam velocity), reducing the axial distance between the reticle and the substrate, and/or increasing the spread angle of the illumination beam.

Figures 2A, 2B, 2C:
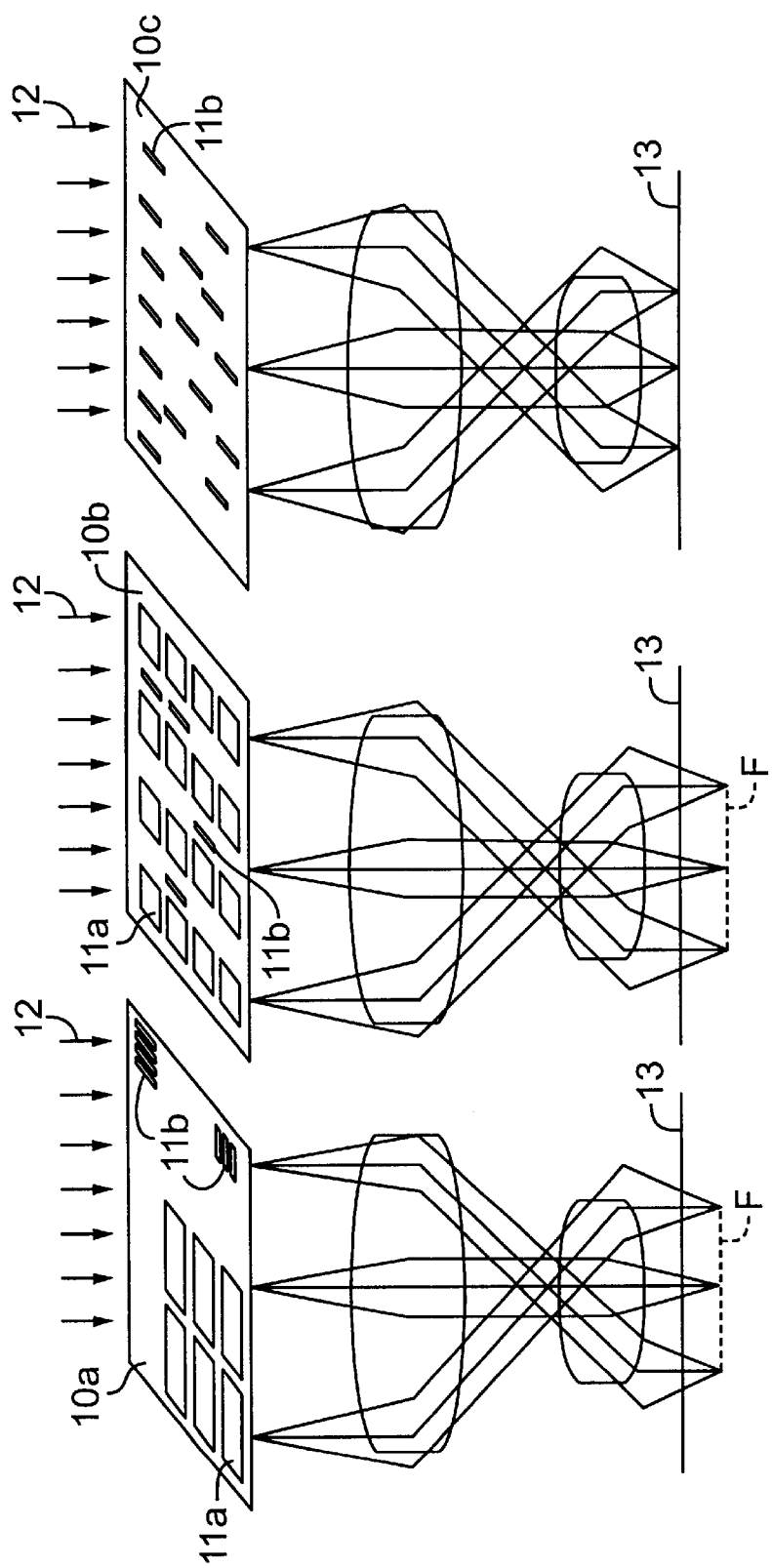
FIGS. 2(*a*)–2(*c*) are respective schematic elevational views depicting certain aspects of the space-charge effect arising during transfer of a respective subfield on the reticle to a corresponding transfer subfield on a sensitive substrate. Each of the respective subfields has a different arrangement of pattern elements, and each respective subfield produces a different respective space-charge effect as observed in the image of the respective subfield.

FIGS. 2(a)–2(c) depict certain aspects of the space-charge effect arising during transfer of a particular subfield on the reticle to a corresponding transfer subfield on a sensitive substrate. FIGS. 2(a)–2(c) depict three respective subfields 10a, 10b, 10c (the subfields 10a–10c are configured as if the reticle were a "scattering-stencil" reticle). Each of the subfields 10a–10c contains a respective arrangement of pattern elements. In the scattering-stencil reticle, each pattern element is configured as a respective void or "aperture" in the reticle. The pattern elements are transmissive to the illumination beam. The subfields 10a and 10b each contain relatively large elements 11a and relatively small elements 11b.

During exposure of a subfield 10a–10c, the illumination beam 12 is incident on the respective subfield; charged particles of the illumination beam 12 passing through the pattern elements 11a, 11b propagate (as a patterned beam) to a respective transfer subfield on the sensitive substrate 13. Portions of the illumination beam 12 incident on any portion of an illuminated subfield other than a pattern element are scattered and thus do not propagate to the sensitive substrate 13 and thus do not contribute to exposing the resist on the substrate 13.

In FIG. 2(a), the larger pattern elements 11a are concentrated near the left-hand corner of the respective subfield 10a, and the smaller pattern elements 11b are concentrated along the right edge of the respective subfield 10a. In FIG. 2(b), the larger pattern elements 11a and smaller pattern elements 11b are distributed essentially evenly over the respective subfield 10b. The subfield 10c shown in FIG. 2(c) contains only smaller pattern elements 11b (essentially evenly distributed). In FIGS. 2(a)–2(c), it is assumed that the illumination-beam current, accelerating voltage, reticle-to-substrate distance, projection-optical system, and illumination-beam spread-angle distribution are the same.

Because the subfield 10a in FIG. 2(a) has a relatively large number of larger pattern elements 11a, the patterned-beam current at the sensitive substrate 13 is comparatively large, causing the focal point to be situated below the plane of the substrate 13, as indicated by the dotted line F in the drawing. Although not shown, the uneven distribution of pattern elements 11a, 11b in FIG. 2(a) also causes "field curvature" (in which the focal points for the pattern elements 11a and 11b are in different locations) and any of various astigmatisms in the lengthwise direction of the transfer subfield. In addition, the transferred image of the illuminated reticle subfield 10a, which should have a square profile as indicated by the dotted lines 14a in the figure, is distorted (due to the space-charge effect) into a diamond-shaped profile indicated by the solid lines 15a. Such distortion is indicative of SCE-based aberrations involving variations in one or more of orthogonality, rotation, magnification, and/or position of the image.

As used herein, "anisotropic magnification distortion" is a type of SCE-based distortion illustrated by the distortion of an ideal square shape into a rectangular shape, and "orthogonality" is a type of SCE-based distortion illustrated by the distortion of an ideal square shape into a diamond shape.

The subfield 10b of FIG. 2(b) also has larger pattern elements 11a that produce larger downstream beam currents and shift the image focal point F below the plane of the substrate 13. The image of the illuminated subfield 10b on the substrate 13 also exhibits variances in magnification and rotation, as indicated by the solid lines 15b relative to the dotted lines 14b.

Unlike FIGS. 2(a) and 2(b), the subfield 10c of FIG. 2(c) has no larger pattern elements 11a, only smaller pattern elements 11b. The beam current downstream of the reticle is therefore less, and almost no shift in image focal point occurs from the plane of the substrate 13. Also, as indicated by the superpositions of the lines 14c and 15c, the subfield image on the substrate is affected very little by the space-charge effect.

Accordingly, a high-resolution exposure can be performed by computing, for each subfield, correction data for correcting SCE-based aberrations. The numerical values of the correction data are based on different respective values of the parameters, discussed above, prevailing in each subfield. Based on the numerical values of the correction data, exposure corrections are made to cancel the particular SCE-based aberration(s) exhibited in the subfield image for the respective subfield. In cases in which field curvature and non-linear distortion due to SCE-based aberrations are not negligible, where SCE-based aberrations such as focus and image-magnification errors vary according to location within the subfield, numerical values of particular correction data may be based on an average of aberrations at various points in the transferred subfield. The greatest weight can be assigned to locations in the subfield having the narrowest linewidths.

Correction data for correcting an SCE-based aberration in a pattern image can be calculated in advance of making an actual exposure of the pattern. This pre-calculated data can be based on design parameters and characteristics of a calibration or test pattern. The pre-calculated correction data desirably are "calibrated" to ensure optimal aberration correction. To "calibrate" correction data, at least one calibration pattern, as provided on a calibration reticle or reticle stage, actually is exposed onto a substrate. Any actual aberrations in the image of the calibration pattern are measured to obtain actual (measured) aberration data. A "correction coefficient" is computed for the calibration pattern from the difference between the data for actually measured aberrations and the pre-calculated (non-calibrated) aberration-correction data. The correction coefficient is applied to the pre-calculated aberration-correction data to yield respective "calibrated" correction data. Then, during an actual exposure of an image of a corresponding region of a reticle, the imaging is "corrected" according to the calibrated correction data.

To obtain the correction coefficient, multiple (e.g., 10–20) different calibration patterns (defined on a calibration reticle or the reticle stage) desirably are used so as to obtain a corresponding number of correction coefficients (corresponding to different respective regions of the reticle) that can be stored in a computer memory or the like for later recall.

The SCE-based aberrations that are the subject of these calibrations can be selected from a group including image-resolution aberrations (e.g., focus, astigmatism) and distortion aberrations (e.g., image magnification, image rotation, image orthogonality, and anisotropic magnification). Focus and astigmatism normally are obtained from measured changes in position of the image (or portions thereof) in the optical-axis (z-axis) direction.

Measurements for determining respective optimal imaging positions (positions exhibiting greatest correction of aberrations) for correcting SCE-based focus and astigmatism can be made by producing a mark-detection signal in real time while adjusting the axial position of the substrate or the focus point of a lens, used for aberration correction, in the z-axis direction. The mark-detection signal can be obtained, for example, from a backscattered-electron (BSE) detector or X-ray detector. A stage-elevation signal can be obtained, for example, using a laser interferometer or height sensor. A stage-position (x,y) signal can be obtained, for example, using a laser interferometer. Alternatively, pattern images on the substrate can be made, developed, and then measured. To make the exposures, the substrate or focus-correction lens is moved incrementally along the z-axis, and an image of the calibration pattern is exposed at each incremental step. The exposed substrate is developed, and the image quality and resolution at each position are measured to determine the optimal position. The measurements can be made using, e.g., an electron microscope designed for critical-dimension measurement of a semiconductor wafer. To quantify the SCE-based distortion of the respective images, distortion "components" are measured such as image rotation, magnification, orthogonality, anisotropic magnification, and higher-order non-linear distortion. The measured and computed values of these distortions are then compared to determine the proper and most optimal corrective action.

A representative calibration pattern includes multiple equally spaced beam-transmissive slit apertures in a reticle membrane (see discussion below regarding FIGS. 4(a)–4(f)). The calibration pattern is projected onto a corresponding pattern of equally spaced heavy-metal linear features 64 provided on a substrate or on the substrate stage (FIG. 4(g)), and measurements are obtained of how the images of the slit features are affected by a subject aberration. Aberrations can be measured for the entire calibration pattern by mounting the calibration pattern and substrate on respective reticle and substrate stages that are movable in at least two dimensions. In making the measurements, it is desirable that differences in z-axis position due to variations in substrate thickness be taken into account.

As noted above, a number of calibration patterns on a single calibration reticle or the like can be used. Desirably, the various calibration patterns on a calibration reticle include "dummy" elements in a different arrangement in each calibration pattern (as discussed below regarding FIGS. 4(a)–4(f)). The "dummy" elements provide a deliberately controlled manipulation of the beam current, passing through the calibration patterns, from one calibration pattern to another. Also, by providing many separate calibration patterns, each including multiple slit apertures, on the calibration reticle, aberrations can be measured at a large number of different points within a calibration reticle, thereby improving the accuracy of the measurements.

From the data obtained during the measurements, the respective magnitudes of actual SCE-based aberrations exhibited by respective images of the various calibration patterns are determined. For each calibration pattern, the results of these determinations are compared to respective data for SCE-based aberrations theoretically expected from the calibration pattern based solely on computations using design-configuration data for the calibration pattern. These comparisons are made for the various calibration patterns on the calibration reticle. Any difference between actually measured aberrations and theoretical aberrations can be expressed as a respective "proportionality coefficient" for each calibration pattern and for each SCE-based aberration in question. For example, if the actually measured and theoretical values of focal-point variance for a given calibration pattern are 45 μm and 50 μm, respectively, then the proportionality coefficient for the particular calibration pattern, with respect to focal point, is 45/50=0.9. Similarly, if the actually measured and theoretical values of magnification variance for a given calibration pattern are 1000 ppm and 1200 ppm, respectively, then the proportionality coefficient for the calibration pattern, with respect to magnification, is 0.833. Proportionality coefficients for each calibration pattern and for each SCE-based aberration of interest can be determined in this manner.

When images of the reticle actually are exposed onto a sensitive substrate, the pre-calculated data for correcting SCE-based aberrations for each subfield of the reticle being transferred are multiplied by respective proportionality coefficients to obtain actual data for correcting the SCE-based aberrations. To determine which correction coefficient for a given calibration pattern to apply to a given subfield of the reticle, the subfields and calibration patterns can be assigned in advance to classes (the number of classes can correspond to the number of different calibration patterns). In this instance, the SCE-based-aberration-correction data used for a given subfield are the data for the calibration pattern of the same class as the subfield. Alternatively, an average of each of the proportionality coefficients determined, for a given SCE-based aberration (e.g., magnification), for all the calibration patterns can be used to make corrections for all subfields.

The invention also encompasses data-conversion methods for converting data, as used for computing an amount of correction to be applied to a beam, so as to correct an SCE-based aberration in a subfield on a reticle. In the data-conversion method, data concerning an SCE-based aberration are calculated based on factors such as the distribution of pattern elements (e.g., corresponding beam-transmissive voids in a reticle membrane), the illumination-beam current, the spread-angle distribution of the illumination beam as incident on the reticle, the acceleration voltage of the illumination beam, the axial distance between the reticle and the substrate, and the optical characteristics of the projection-optical system. From the calculated SCE-based aberration data, respective actual correction data are determined.

This data-conversion method can be used: (a) at the time when reticle-design CAD data are being converted into an actual reticle (i.e., at time of reticle fabrication); (b) in the microlithographic tool following reticle fabrication; and (c) prior to exposing the reticle, when making a determination as to which type of microlithography tool is to be used in making the exposures. Thus, the data-conversion method can be used to upgrade CAD capability in configuring a reticle to produce corrections of SCE-based aberrations as reticle-design data are being generated. If the data conversion is being performed at the time the reticle is being fabricated from integrated-circuit design data, then software for computing corrections of SCE-based aberrations can be used in combination with existing data-conversion software (e.g., by connection through a common interface).

In the foregoing data-conversion method, the step of computing SCE-based aberrations that would be exhibited by a projected reticle subfield can be performed by first computing a distribution of space-charge that would be generated between the subfield on the reticle and the substrate by the patterned beam. From that distribution of space-charge, the distribution of electrostatic potential created thereby is calculated and used to calculate a beam trajectory suitable for correcting the expected SCE-based aberration or used to compute a change in beam trajectory suitable for correcting the SCE-based aberration.

Figure 5:
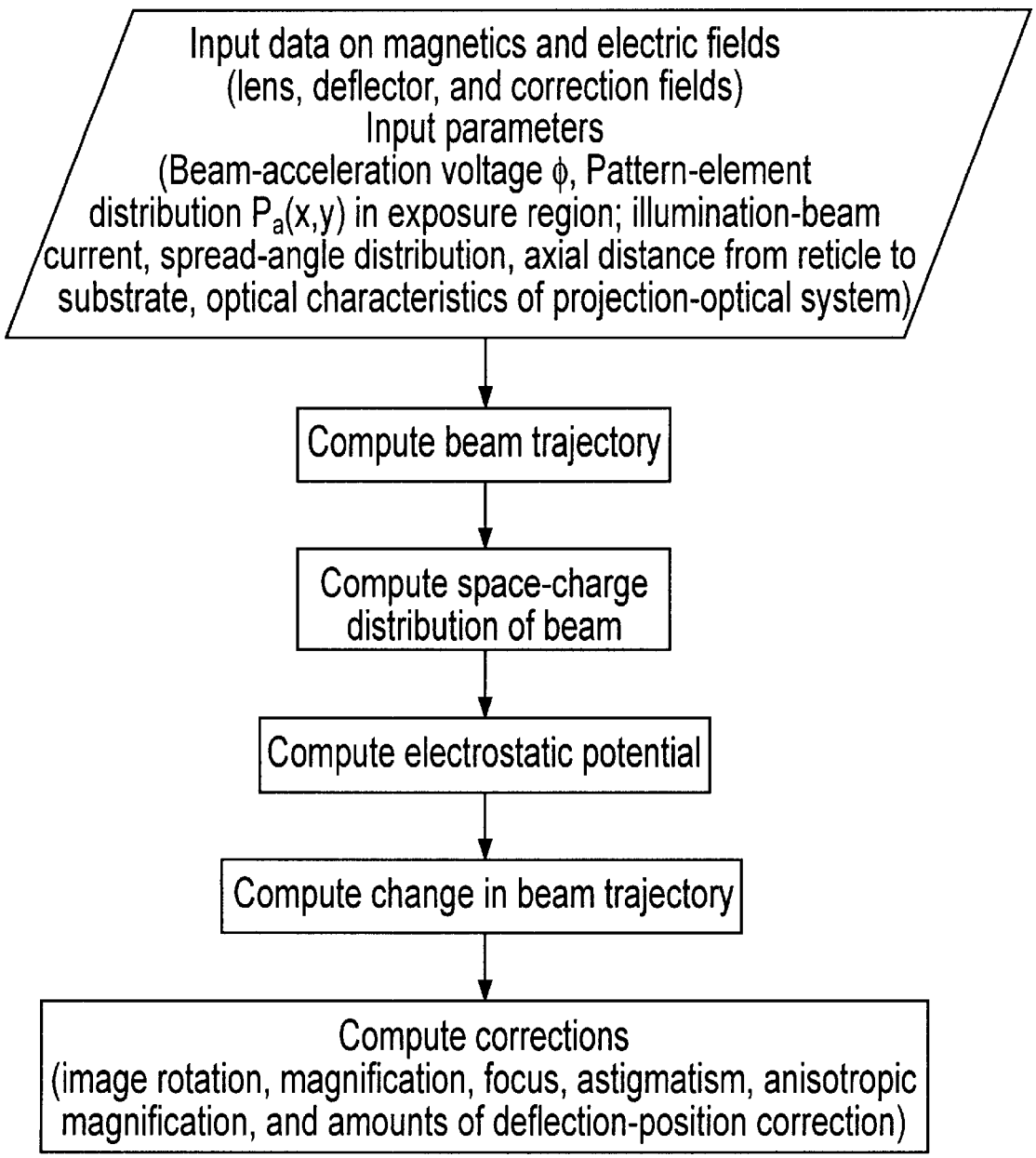
FIG. 5 is a flowchart depicting a representative procedure, according to the invention, for computing a correction to SCE-based aberrations.

A representative procedure for performing this calculation is depicted in FIG. 5. First, data are input for magnetic fields and various other system parameters, from which a beam trajectory is computed. To compute the trajectory, a direct ray-tracing method can be used involving an equation of motion for the charged particles of the beam. Saito et al., *J. Vac. Sci. Technol.* A4(4):1913–1917, July/August 1986. Alternatively, any of various other existing computational methods can be employed.

Figure 6:
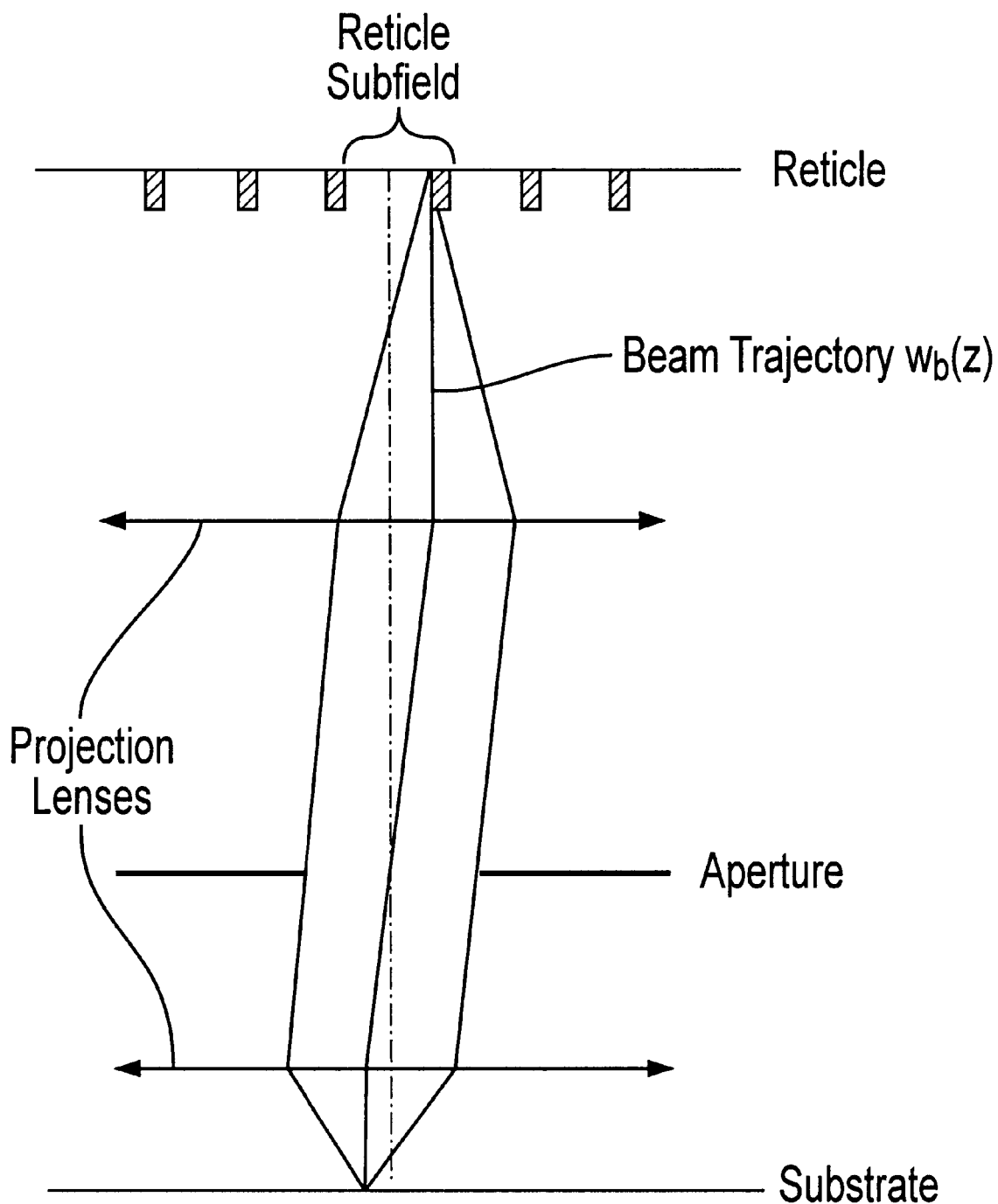
FIG. 6 is a schematic elevational diagram of an exemplary beam trajectory in a divided-reticle microlithography system.

FIG. 6 shows an example of a beam trajectory in a divided-reticle microlithography system including two projection lenses and an aperture situated between the reticle and the substrate. In FIG. 6, a subfield is being illuminated, and the depicted beam trajectory $w_b(z)$ is that for the principal ray from a given point in the illuminated subfield. In FIG. 6, the illumination beam is incident substantially perpendicularly to the reticle. Beam trajectories referred to herein include not only the principal-ray trajectory $w_b(z)$, but also any of various other trajectories $w(z)$.

Figure 7:
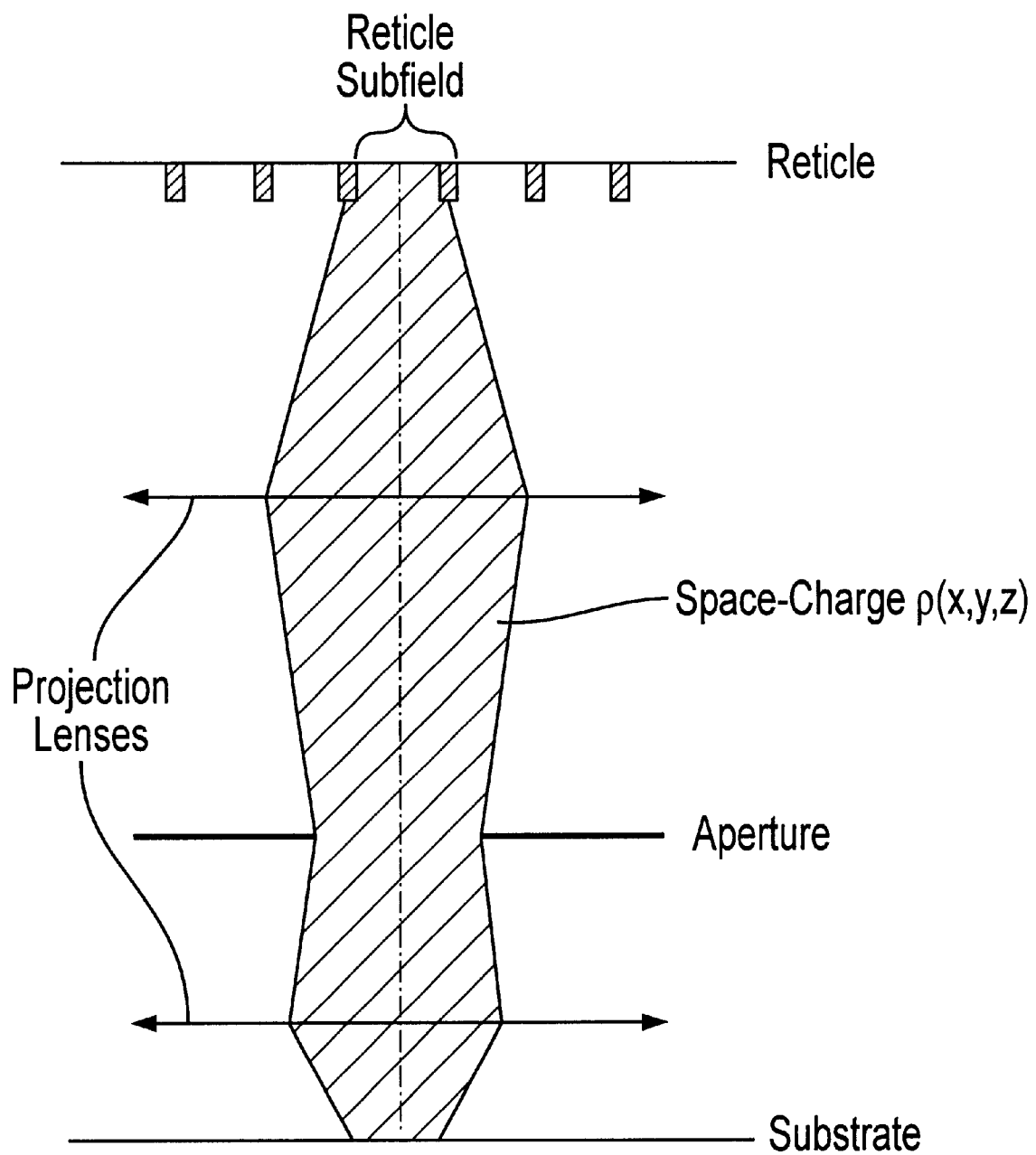
FIG. 7 is a schematic elevational diagram of a representative space-charge distribution under the conditions of FIG. 6.

Next, the space-charge distribution created by the patterned beam (propagating between the reticle and substrate) is computed. FIG. 7 shows a representative space-charge distribution under the conditions of FIG. 6. The cross-hatched region in FIG. 7 represents the actual space-charge distribution created by the patterned beam. This space-charge distribution $\rho(x,y,z)$ can be computed by any of various methods.

From the computed space-charge distribution $\rho(x,y,z)$, the corresponding electrostatic potential is computed. In order to compute the magnitude of SCE-based aberration occurring in an image of a given subfield, the beam trajectory is recomputed by adding the electrostatic potential thus computed to the electrostatic potential expressing the beam-acceleration voltage and to the electrostatic potential derived from the electric field generated by the projection lenses. From this computed magnitude of SCE-based aberration, data for correcting the SCE-based aberration can be obtained.

Alternatively, instead of using the computed electrostatic potential to recompute the beam trajectory, the electrostatic potential can be used to determine the electric field (or equivalent electrostatic potential expressing same), then to calculate the displacement (perturbation) of the trajectory itself. This facilitates a determination of the required change in the beam trajectory to correct the SCE-based aberrations.

Correction data for correcting an SCE-based aberration are computed from the space-charge distribution. Since the charged particles of the beam are in motion, they constitute an electrical current (albeit small, on the order of a few tens of microamps), which represents a current distribution. This current distribution has associated therewith a corresponding small magnetic field. To provide even more accurate correction of SCE-based aberrations, it is desirable to account for magnetic-field changes associated with this current distribution.

In divided-reticle CPB microlithography, tens of thousands of subfields are required to define an entire chip for exposure (multiple reticles may be available to expose one chip). Calculations for determining corrections of SCE-based aberrations desirably are performed for each subfield. Using a Monte Carlo computational method, it could take anywhere from several hours to a week to perform the calculations for a single subfield. Reducing this huge (and impractical) computational time is required. To such end, the subfields are regarded as including a large number of different and finely detailed pattern-elements. The accompanying space-charge effect is computed by substituting, for certain aggregates of finely detailed pattern elements, a much smaller number of basic graphic shapes that are the equivalent of the corresponding aggregates in terms of producing a certain space-charge effect. This substantially reduces the time required by a computer to process data for all the pattern elements. To such end, the subfields are further divided into "sub-subfields," wherein each sub-subfield contains at least one pattern-element shape. Desirably, several characteristics are quantified to characterize all the pattern elements within each sub-subfield. From one to several graphic figures having the same characteristics quantities are derived and substituted, in the computations, for the actual fine-pattern data.

Figure 8A:
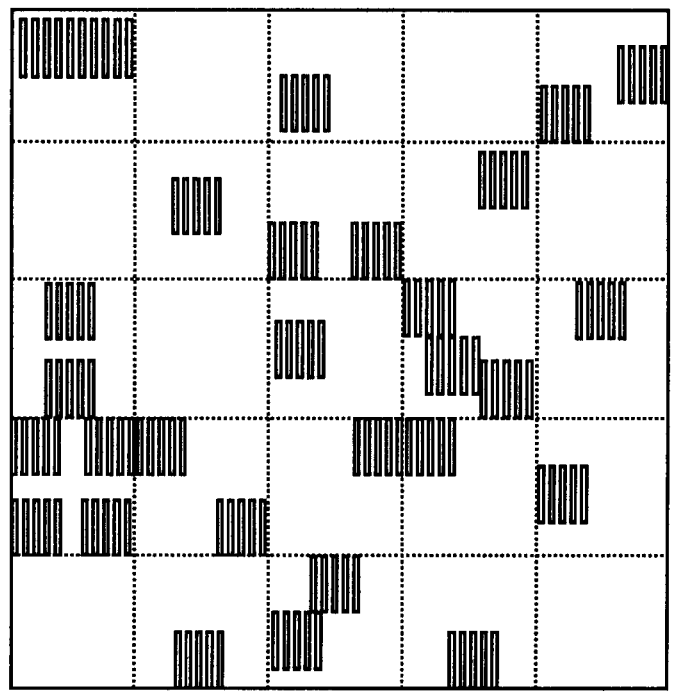
FIG. 8(*a*) schematically depicts a reticle subfield divided into 25 sub-subfields each containing at least one group of fine pattern elements.
Figure 8B:
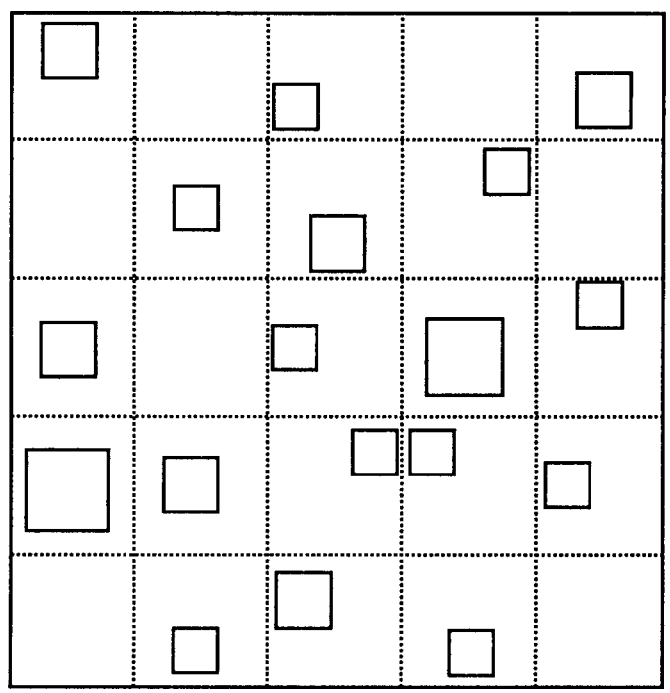

This scheme is shown in FIGS. 8(a)–8(b), wherein FIG. 8(b) depicts squares (as representative basic graphic shapes) that are configured and placed on a subfield (FIG. 8(b)) based on the areas and centroids of respective groups of pattern elements (FIG. 8(a)). I.e., FIG. 8(a) shows a subfield containing multiple groups of fine pattern elements to be transferred to the substrate. This subfield is divided into twenty-five sub-subfields. In FIG. 8(b), the respective area and centroid location of each group of fine pattern elements within the sub-subfields of FIG. 8(a) have been computed, and the actual group(s) of elements in each sub-subfield have been replaced with respective squares. Each square has a respective area and centroid location corresponding to the respective group of elements. Using the substituted squares, the complexity of (and time required to execute) the calculations for determining the actual space-charge effect produced by the subfield are reduced substantially.

The area and centroid of a group of pattern elements in a subfield can be calculated as follows:

Area=$\Sigma S_j$

Centroid$_x$=$(\Sigma G_{xj}S_j)/(\Sigma S_j)$

Centroid$_y$=$(\Sigma G_{yj}S_j)/(\Sigma S_j)$ wherein the range of summation is all the pattern elements within the respective sub-subfield, $S_j$ is the area of a pattern element j existing within the subject sub-subfield (j is an integer equal to the number of pattern elements), and $G_{xj}$ and $G_{yj}$ are the x and y coordinates, respectively, of the centroid of the pattern element (j) in the plane of the pattern.

With "z" denoting position on the optical axis of the charged particle beam, and the x-y plane being perpendicular to the optical axis, a computation of charge distribution $\rho(x,y,z)$ is performed by expressing the distribution of spread-angle of the illumination beam (as incident on the reticle) as a general function of the form $A(x,y,z)$. The charge distribution is calculated using the convolution integral of the spread-angle distribution $A(x,y,z)$ and the distribution of pattern elements (apertures) within the subfield $P_a(x,y)$. Specific values of the spread-angle distribution $A(x,y,z)$ of the illumination beam can be obtained in a pre-computed or pre-measured (and pre-stored in a memory) look-up table of arbitrary definite integrals of the parameters x and y of the distribution $A(x,y,z)$.

More specifically, the following equation can be used to calculate the charge-density distribution $\rho(x,y,z)$ of an arbitrary point (x,y,z) in the charged particle beam:

$\rho(x, y, z) = k*(1/r_b(z))^2$ $*(\iint A(X, Y, z)dXdY)^{-1} * \iint P_a$ $((x_1 * \cos\theta_b(z) + y_1$ $*\sin\theta_b(z))/r_b(z), (y_1$ $*\cos\theta_b(z) - x_1 * \sin\theta_b$ $(z))/r_b(z)) *A$ $(x-x_1, y-y_1, z)dx_1dy_1$ wherein $r_a(z)$, $r_b(z)$, $\theta_a(z)$, and $\theta_b(z)$ are the radial and rotational components of representative trajectories $W_a$ and $W_b$, and k is the illumination-beam charge density immediately upstream of the reticle. Hence, the charge density $\rho(x,y,z)$ is the convolution integral of the spread-angle distribution $A(x,y,z)$ of the illumination beam and the pattern-element distribution $P_a(x,y)$.

Whereas the function $A(x,y,z)$ is referred to as a "spread-angle distribution," if the distribution of the charged particle beam at the crossover is $f(x,y)$, then the spread-angle distribution actually is defined by the equation:

$A(x, y, z) = f(x * r_a(z_{co})r_a(z), y * r_a(z_{co})/r_a(z))$ wherein $Z_{co}$ is the axial position of the crossover along the optical axis. The expression for $A(x,y,z)$ noted above shall apply unless otherwise noted. Because the value of $r_a(z)$ is zero at ($z=z_o$) (i.e., at the reticle surface) and at $z=z_i$ (i.e., at the substrate surface), the value of $(x/r_a(z), y/r_a(z))$ is infinite at these two points only. Accurate computations can be performed with no problems, however, simply by omitting these two points $z_o$ and $z_i$ from actual numerical calculations.

Microlithography-system data such as spread-angle distribution $A(x,y,z)$, acceleration voltage of the illumination beam, illumination-beam current, etc., can be computed or measured in advance. Hence, it is important that conditions affecting these parameters not be changed between the computation of corrections and making an actual exposure (incorporating the computed corrections). For this reason, if the correction data are saved in memory after making the computations, then the correction data can be accessed later during an actual exposure so that the exposure is performed under the same conditions as those under which the calculations were made.

On the other hand, functions having a value of either "1" or "0", such as the distribution function $P_a(x,y)$ of pattern elements, for example, can be generated at time of reticle fabrication. (Pattern-element apertures have a value of "1" and intervening portions of the pattern have a value of "0".) In addition, if it is assumed that all edges of pattern elements extend in either the x or y direction, then the convolution integral thereof can be resolved to the sum of definite integrals of the function $A(x,y,z)$. Accordingly, arbitrary definite integrals of the function $A(x,y,z)$ can be computed in advance and stored in a computer memory in the form of a look-up table. Also, the time required to compute a charge-density distribution ρ(x,y,z) can be shortened by accessing the look-up table when performing convolution integration.

The charge-density distribution ρ(x,y,z) can be computed from a near-axis trajectory. Compared to an approach involving direct ray-tracing (see above) from an equation of particle motion, the near-axis trajectory approach is easier to solve, and requires less computation time. In most CPB microlithography systems, the variance from a near-axis trajectory (i.e., the "trajectory aberration") tends to be minimal. Hence, the difference between the charge-density distribution computed from an actual trajectory and a charge-density distribution computed from a near-axis trajectory also is minimal, and SCE data computed by both approaches tend to agree with a high degree of accuracy. A representative flow chart of this approach is shown in FIG. 9. The main difference between the respective flow charts of FIGS. 9 and 5 is that the flow chart of FIG. 9 provides specific equations for the computations using the near-axis trajectory approach.

Figure 10:
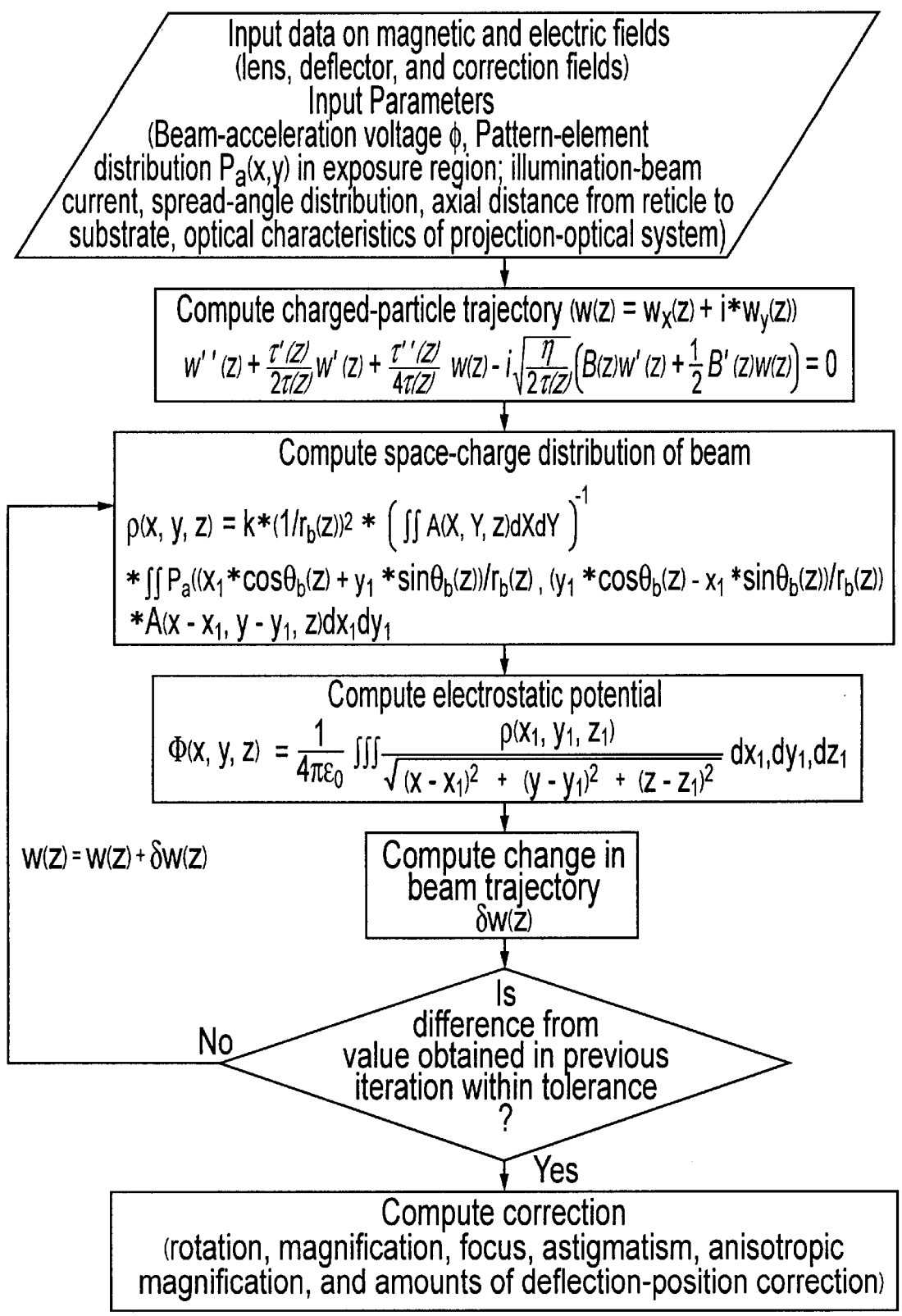
FIG. 10 is a flowchart of a method, according to the invention, for determining a correction to an SCE-based aberration based on an iterative approach. Representative equations used in the calculations are included.

Although the near-axis trajectory approach yields a reduction in computing time, this approach can introduce minor errors or otherwise have residual errors. To correct or otherwise reduce such errors, an iterative approach can be used. The iterative approach is shown in FIG. 10. First, the charge-density distribution created by the patterned beam between the reticle and the substrate is computed using the near-axis trajectory for the projection-lens system. Next, the electrostatic potential generated by the charge-density distribution is computed. Then, a first-order approximation of the SCE-based aberration occurring in a subfield image is computed by re-computing the beam trajectory based on the electrostatic potential. The charge-density distribution created in the space between the reticle and the substrate by the patterned beam is recomputed using the recomputed beam trajectory. Next, the electrostatic potential generated by the recomputed charge-density distribution is computed. Then, a second-order approximation of the SCE-based aberration occurring in the subfield image is computed by recomputing the beam trajectory based on the electrostatic potential. This process is repeated as required until the difference between the values obtained in the additional computation and that obtained in the previous computation converges to within a given tolerance (e.g., 1 nm or less).

Figure 11:
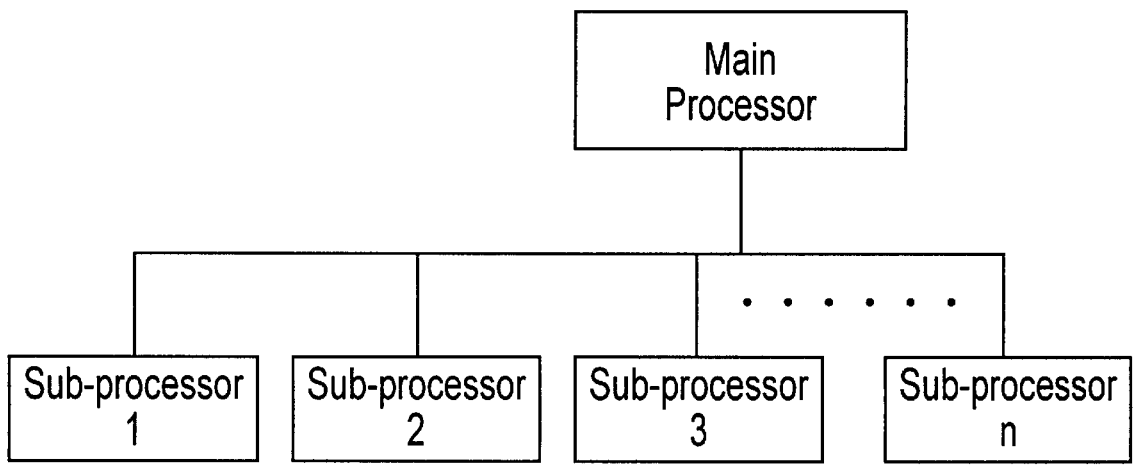
FIG. 11 is a block diagram of parallel processing as can be used to perform calculations in any of the methods according to the invention. Desirably, each sub-processor performs calculations for a respective subfield.

When performing the calculations discussed above, the computations can be speeded up by using parallel processing, in which calculations for multiple subfields are performed simultaneously. In regard to parallel processing, reference is made, for example, to U.S. Pat. No. 5,448,494, incorporated herein by reference. Reference also made to FIG. 11 in which respective corrections for space-charge effects in each of n subfields are computed by respective n sub-processors under the control of a main processor.

In the foregoing discussion, the aberrations that can be corrected include at least one of image rotation, image magnification, focal point, astigmatism, anisotropic magnification, orthogonality, and positional displacement. Thus, any of various aberrations can be corrected.

Also, in the foregoing discussion, the data for correcting SCE-based aberrations, produced from the calculations outlined above, can be used in a CPB-optical system for correcting an aberration due to space-charge effects. The correction data also can be used for correcting the position and/or shape of a pattern portion arranged on a reticle so as to cancel an aberration due to space-charge effects. In practice, it is desirable to divide correction data into a first set that is best utilized by a CPB-correction-optical system, and a second set that is best utilized when designing the reticle. Both sets of data can be used in combination if desired. For example, it is desirable to route correction data pertaining to magnification, rotation, orthogonality, and anisotropic magnification to the CPB-correction-optical system, and correction data pertaining to non-linear distortion to the device fabricating the reticle.

Non-linear distortion encompasses pincushion distortion. Whenever pincushion distortion is excessive, it desirably is corrected at the reticle-design level. This can be accomplished by, for example, laterally shifting the respective positions of certain pattern elements on the reticle according to a countervailing barrel distortion, thereby canceling the pincushion distortion of the reticle image when projected. Linear distortions such as image rotation, magnification, orthogonality, and anisotropic magnification also can be corrected at the reticle-design level.

Although distortion can be corrected at the reticle-design level, because the placement and shape of pattern elements change when a distortion-correcting reticle is made, it is desirable to compute changes in SCE-based aberration that will result from these changes, and to use the computed data for governing appropriate corrections imparted by the CPB-optical system rather than for configuring the reticle itself.

Figure 12:
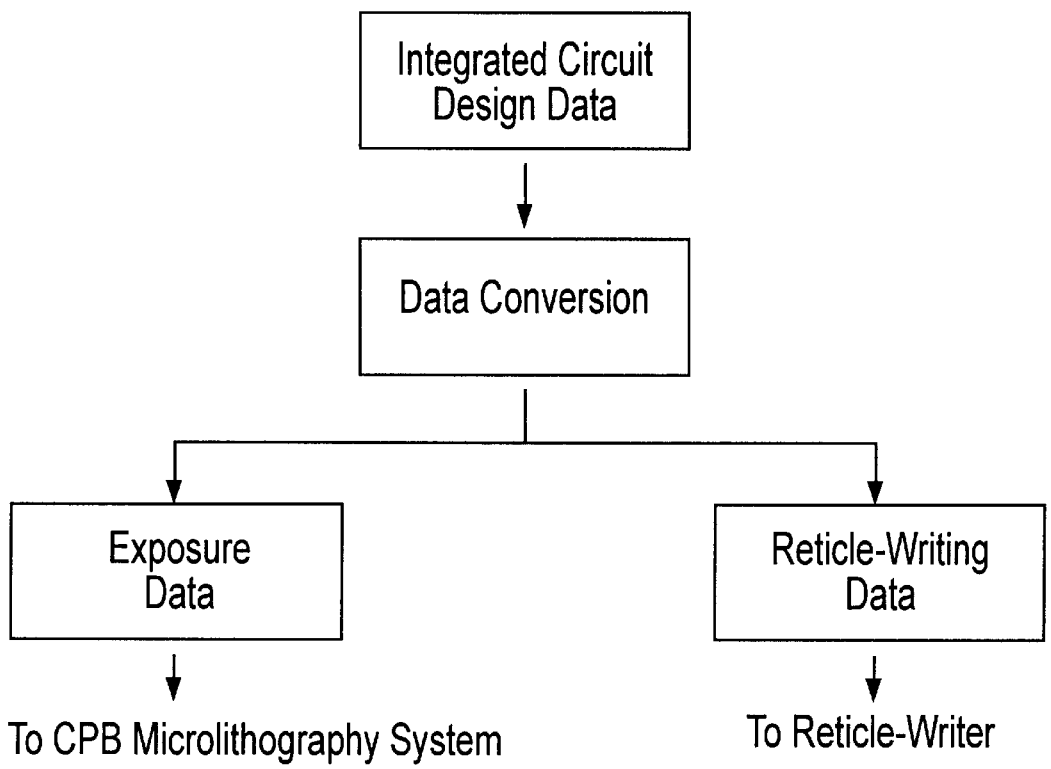
FIG. 12 is a block diagram of a process, according to the invention, for generating exposure data and corresponding reticle-writing data by conversion from integrated-circuit design data.

Corrections at the reticle-design level and at the CPB-optical-system level can be applied independently. FIG. 12 shows a flow diagram for a process, according to the invention, for generating exposure data and corresponding reticle-writing data by conversion from integrated-circuit design data. The SCE-aberration-correction data produced for use by the CPB-correction-optical system can be output as exposure data, and data for correcting pattern-element position and/or shape can be output as reticle-writing data.

Representative Embodiments

Figure 3:
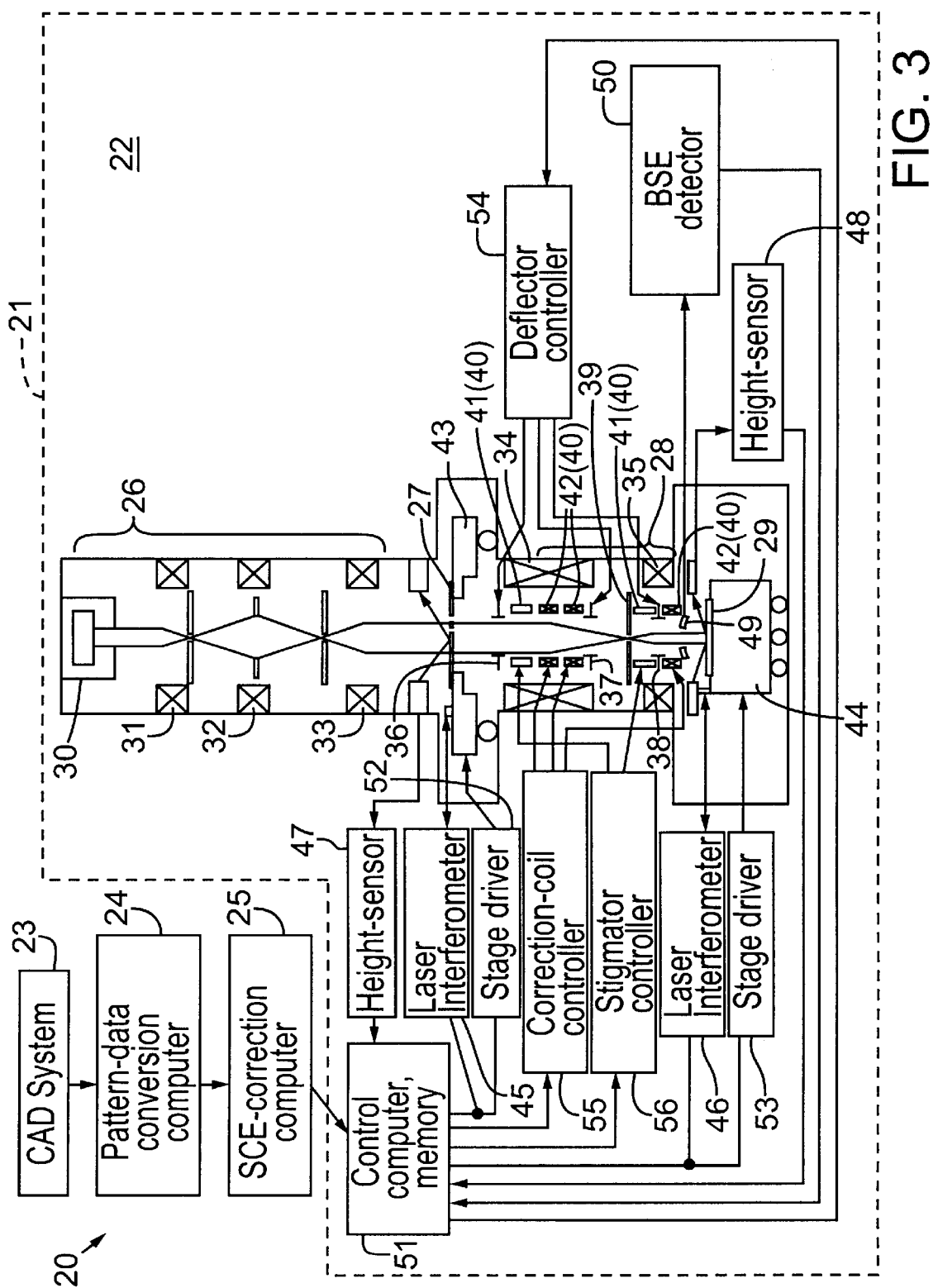
FIG. 3 is a schematic elevational diagram of a CPB microlithography system according to a representative embodiment of the invention.
Figure 4:
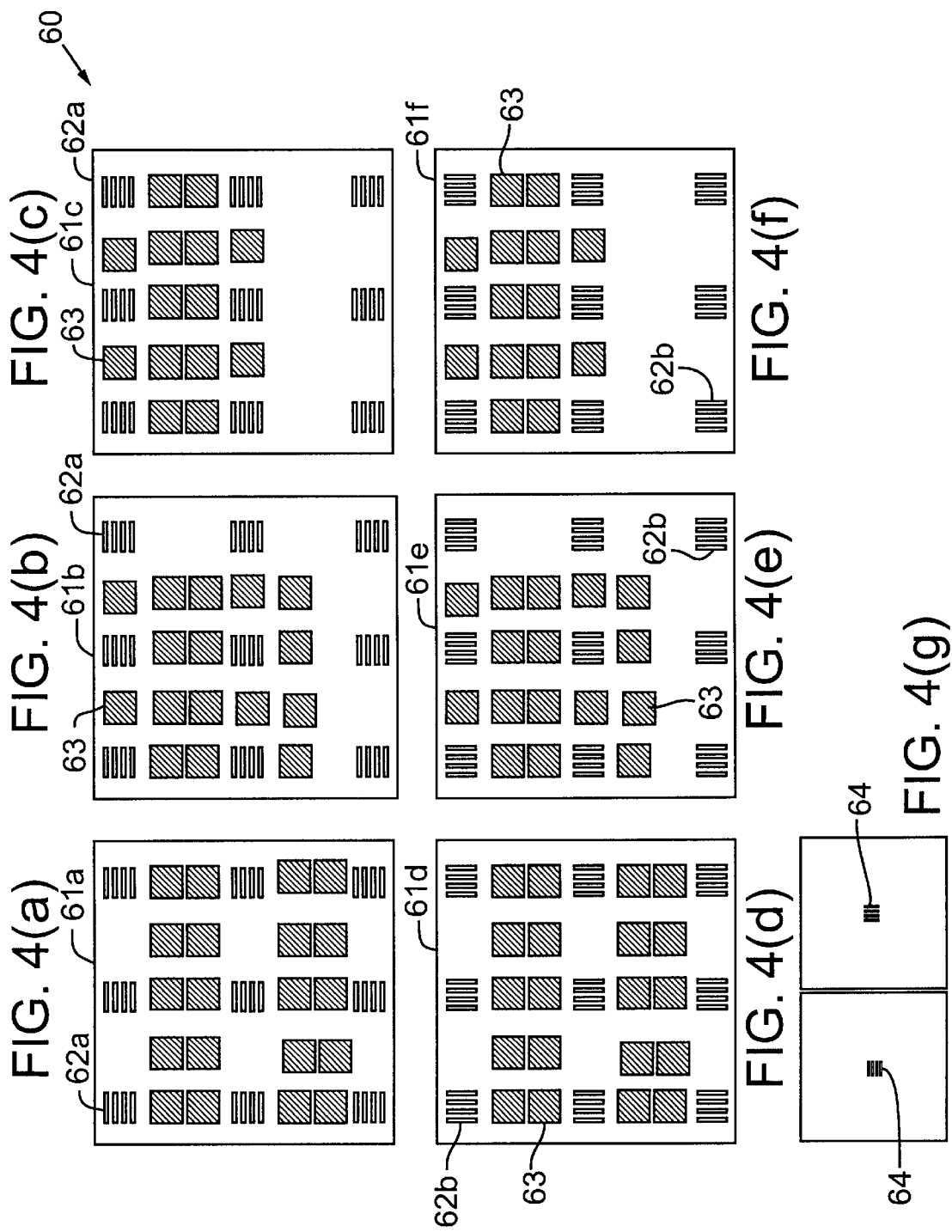
FIGS. 4(*a*)–4(*f*) are plan views of respective calibration patterns that can be projected onto corresponding patterns of linear features provided on a substrate or the substrate stage. The calibration patterns can be used for quantifying SCE-based aberrations of projected images, such aberrations including image rotation, image magnification, image orthogonality, image anisotropic magnification, and higher-order non-linear distortions of the image.

A representative embodiment of a CPB microlithography system is depicted in FIG. 3. The FIG. -3 embodiment specifically is an electron-beam microlithography system that utilizes a segmented (divided) reticle as described above. The portion enclosed within the dotted line 21 constitutes a "main unit" 22 of the apparatus 20 that normally is installed in a clean room. A CAD system 23, pattern-data-conversion computer 24, and an SCE-correction computer 25 (all located outside the dotted line 21) normally are situated outside the clean room containing the main unit 22.

The main unit 22 comprises an illumination-optical system 26 that illuminates a selected portion of a reticle 27 with an electron beam EB (specifically an illumination beam), and a projection-optical system 28 for forming an image, on a sensitive substrate 29, of the illuminated portion of the reticle 27. The illumination-optical system 26 includes an electron gun 30, illumination lenses 31, 32, 33, and deflectors (not shown). The projection-optical system 28 includes projection lenses 34, 35, a contrast aperture 39, and an SCE-correction optical system 40.

The SCE-correction optical system includes at least two stigmators 41, at least three focus-correction coils 42, and three deflectors 36, 37, 38 (at least one deflector is required). This configuration of the SCE-correction optical system allows independent correction of image rotation, magnification, focal point, astigmatism, anisotropic magnification, orthogonality, and position. More specifically, the focus-correction lenses 42 can be used to correct image focus, rotation, and magnification. Each of the stigmators desirably is a multi-pole lens that can be used for correcting astigmatism, orthogonality, and anisotropic magnification of the image. The deflector(s) can be used for adjusting the position of the image on the substrate. The use of a combination of at least three focus-correction lenses permits one or more of image rotation, magnification, and focus to be adjusted as required. The use of a combination of at least two stigmators permits one or more of image astigmatism, orthogonality, and anisotropic magnification errors to be adjusted as required. Hence, corrections can be made to improve exposure accuracy substantially, even when the above-noted aberrations occur in arbitrary ratios dependent upon SCE-related parameters such as distribution of beam-transmissive pattern features within the subfield, the illumination-beam current, the illumination-beam spread-angle distribution, the illumination-beam acceleration voltage, the axial distance from the reticle to the substrate, and optical characteristics of the projection-optical system.

Regarding the focus-correction lenses, all can be electromagnetic, two can be electromagnetic and the other electrostatic, or one can be electromagnetic and the others electrostatic. Regarding the stigmators, all can be electromagnetic, all can be electrostatic, or one can be electrostatic and the other electromagnetic. These combinations can be changed as appropriate for use with magnetic deflector(s) or electrostatic deflector(s).

The reticle 27 and sensitive substrate 29 are each mounted on a respective stage 43, 44. Each stage 43, 44 can undergo movement in at least two dimensions. Each stage 43, 44 is provided with a respective laser interferometer 45, 46 that provides linear positional-measurement data concerning the respective stage 43, 44. Also provided are respective height sensors 47, 48 for measuring the "height" (position along the vertical axis, or z-axis, of the figure) of the reticle 27 and sensitive substrate 29. Also provided are a backscattered-electron (BSE) detector 49 and BSE-detector circuit 50 (to be described later) for measuring aberrations of images projected onto the substrate 29.

General system operation is controlled by a control computer 51 connected to various components. For example, the control computer 51 is connected to and receives electrical signals from the BSE-detector circuit 50. The control computer 51 also is connected to and receives measurement data from the height sensors 47, 48 and the interferometers 45, 46. The control computer 51 is understood to include a memory for storing data input to the control computer, such as data corresponding to correction parameters for correcting SCE-based aberrations, as discussed above. Also, the memory allows virtually instant data recall useful for making real-time corrections or corrections as required at time of exposure.

The control computer 51 is connected to and routes respective control signals to a reticle-stage driver 52 (connected to the reticle stage 43), a substrate-stage driver 53 (connected to the substrate stage 44), a deflector controller 54 (which includes deflector drivers and is connected to each of the deflectors 36–38), a correction-coil controller 55 (which includes correction-coil drivers and is connected to the focus-correction coil 42), and a stigmator controller 56 (which includes a stigmator driver and is connected to the stigmator 41). The lenses 31–33 of the illumination-optical system 26 and the lenses 34–35 of the projection-optical system 28 also are connected to and actuated based on respective control signals from the control computer 51.

The CAD system 23 outputs circuit-pattern data to the pattern-data-conversion computer 24. The pattern-data-conversion computer 24 performs various calculations regarding the arrangement of pattern elements on the reticle 27, including, for example, dividing the pattern into subfields. These processed reticle-pattern data are routed to the SCE-correction computer Set parameters for the illumination-optical system 26 and projection-optical system 28 are entered into the SCE-correction computer 25, desirably in advance of use. These set parameters include (but are not limited to) illumination-beam current, illumination-beam spread-angle distribution, illumination-beam acceleration voltage, axial distance between reticle 27 and substrate 29, and optical characteristics of the projection lenses 34, 35. The SCE-correction computer 25 computes space-charge effects for each subfield of the reticle 27 based on the set parameters and on the pattern-element data for the particular subfield (i.e., the distribution of pattern elements within the subfield). From this computed aberration data, the SCE-correction computer 25 determines how much correction of SCE-based aberrations is required for the respective subfield, and stores data pertaining to the respective correction in a memory of the control computer 51.

The main unit 22 transfers the circuit pattern from the reticle 27 to the sensitive substrate 29, subfield-by-subfield. As exposure proceeds from one subfield to the next, SCE-based aberrations in the transferred image of each subfield are corrected based on this correction data. More specifically, in this embodiment, as the pattern is transferred, the transferred image of each subfield is corrected for rotation, magnification, focus, astigmatism, orthogonality, anisotropic magnification, and positional displacement arising from space-charge effects.

Calibration of the SCE-correction optical system is performed using the reticle stage 43, substrate stage 44, the respective stage drivers 52, 53, and the respective interferometers 45, 46. A pattern of one or more calibration subfields, provided either on a calibration reticle or on the reticle stage 43, is projected onto a corresponding calibration-mark pattern (not shown, but defined by a layer of heavy metal) on the substrate stage 44. Electrons backscattered from the calibration-mark pattern are detected by the BSE detector 49. Meanwhile, the positional coordinates of the calibration pattern and of the calibration mark are measured by the interferometers 45, 46. Image focus and astigmatism are detected from the BSE signal differential and from data provided by the height sensors 47, 48. Aberrations due to space-charge effects can be determined by analyzing the BSE signal, the positional-coordinates data, and the height data. SCE-based aberrations associated with the calibration pattern are computed in advance by the SCE-correction computer 25. Calibration of the SCE-based aberrations can be performed by comparing these previously computed and measured values.

A calibration pattern 60 such as that shown in FIGS. 4(a)–4(f) can be used to provide calibration subfields 61a–61f. During use, the calibration pattern 60 is situated at the reticle plane. Each of the calibration subfields 61a–61f comprises measurement patterns 62a or 62b (used for performing actual measurements) and dummy patterns 63. A measurement pattern 62a, 62b can have equally spaced linear elements, as shown in FIGS. 4(a)–4(f), or an equally spaced grid configuration. The size and shape of a corresponding calibration mark on the substrate stage 44 are the same as the respective size and shape of a demagnified image of a measurement pattern 62a, 62b as projected on the substrate by the projection-optical system 28. The dummy patterns 63 are provided to increase the reticle-feature ratio of the calibration array 60 (the "reticle-feature" ratio is the ratio of the illumination area that is transmissive to the illumination beam to the reticle area that scatters the illumination beam).

In FIGS. 4(a)–4(f), the dummy patterns 63 are square through-apertures denoted in the drawing by solid black squares. The dummy patterns 63 are not used for making measurements, but rather serve to make the space-charge effect more conspicuous by increasing the beam current being transmitted through the reticle 27. The space-charge effect (and attendant SCE-based aberrations) varies depending upon how the dummy patterns 63 are arranged within a subfield 61a–61f. For measurement purposes, from one to several tens of different calibration subfields 61a–61f desirably are provided by varying the arrangement of the dummy patterns 63 within the subfields. The accuracy of the proportionality coefficients discussed earlier can be improved by increasing the number of measurement patterns 62a, 62b and increasing the number of times the measurements are repeated.

A "weighted least squares" method, for example, may be used to determine how much correction by the SCE-correction optical system is required to minimize SCE-based aberrations. Whenever focus and astigmatism corrections are weighted, the weighting is performed separately from the weighting of correction values for distortions (image rotation, magnification, orthogonality, and anisotropic magnification). The weighting of focus and astigmatism corrections may be divided into equal portions for weighting each measurement point. The best way to weight distortion, on the other hand, is to base it on the distance between the pattern centroid and the center of the subfield. One weighting method, for example, is to calculate the locations of centroids of the measurement patterns 62a, 62b arranged in a subfield 61a–61f and assign weights proportional to the distance between the centroid and the center of the subfield.

An example computation of space-charge effect will now be described. The feature-distribution function of a given subfield in the reticle is expressed as $P_a(x,y)$, and the illumination-beam spread-angle distribution at a point illuminated on the reticle is expressed as $A(x,y,z)$. If the distribution of the charged particle beam at the crossover is $f(x,y)$, then the function $A(x,y,z)$ is defined as:

$$A(x, y, z) = f(x^* \, r_a(z_{co})/r_a(z), \, y^* r_a(z_{co})/r_a(z))$$

The trajectory of a charged-particle ray emerging in an arbitrary direction $(x_0', y_0')$ from an arbitrary point $(x_0, y_0)$ in a subfield is computed from the electric and magnetic fields of the projection lenses. The method used for this computation may be the known direct-ray-tracing method, or a method involving the solution of near-axis-trajectory equations. For example, with the direct-ray-tracing method, trajectories may be computed randomly for 50,000 particles for initial conditions of $(x_0, y_0)$, $(x_0', y_0')$, weighted with an angular distribution at the reticle and with a charged-particle density $\rho(x,y,z)$ determined from the number of charged particles intersecting a plane extending perpendicularly to the optical axis at an arbitrary point z on the optical axis. By performing the computations for the 50,000 or more particles under different initial conditions, a sufficiently accurate value of $\rho(x,y,z)$ can be computed. If the lens-system aberrations are known to be sufficiently small, then there will be little difference in the trajectory obtained by direct ray tracing versus the near-axis trajectory, in which case the near-axis trajectory may be used.

Computations using equations for near-axis trajectory are as described below. Charged particle beams conform to the following near-axis trajectory equation (Zhu and Munro, *Optik* 61:121–145, 1982). The near-axis trajectory (i.e., first-order trajectory) as expressed by the complex expressions used in the above article is given by the equation:

$$w''(z) + \frac{\tau'(z)}{2\tau(z)} w'(z) + \frac{\tau''(z)}{4\tau(z)} w(z) - i \sqrt{\frac{\eta}{2\tau(z)}} \left( B(z) w'(z) + \frac{1}{2} B'(z) w(z) \right) = 0$$

In the equation above, $w(z)$ is the near-axis trajectory of the charged particle beam (the z-direction is the direction of the optical axis), with the x-direction component $w_x(z)$ and the y-direction component $w_y(z)$ thereof being consolidated in the imaginary unit i in the complex expression $w(z)=w_x(z)+i \cdot w_y(z)$. The function $\tau(z)$ is the sum of the electrostatic potential created by electrostatic lenses and the electrostatic potential expressed by the illumination-beam acceleration voltage; $B(z)$ is the magnetic field created by electromagnetic lenses; and $\eta$ is the specific charge of a charged particle, as expressed by $\eta=e/m$, wherein e is the electric charge of the charged particle and m is the mass of the charged particle. The "'" designation is the z differential.

For the general equation of the near-axis trajectory of a charged particle in a charged particle beam leaving a point $(x_0, y_0)$ on the surface $(z=z_o)$ of the reticle in an angular direction of $(x_o', y_o')$, the solution of the equation for near-axis trajectory can be expressed as a combination of four basic solutions for $r_a(z)$, $\theta_a(z)$, $\theta_b(z)$, and $r_b(z)$, which can be expressed as noted in the following equations:

$$w_x(z) = \sqrt{(x_0^2 + y_0^2)} \, r_b(z) \cos\left(\theta_b(z) + \arctan\left(\frac{y_0}{x_0}\right)\right) +$$

$$\sqrt{(x_0'^2 + y_0'^2)} \, r_a(z) \cos\left(\theta_a(z) + \arctan\left(\frac{y_0'}{x_0'}\right)\right)$$

$$w_y(z) = \sqrt{(x_0^2 + y_0^2)} \, r_b(z) \sin\left(\theta_b(z) + \arctan\left(\frac{y_0}{x_0}\right)\right) +$$

$$\sqrt{(x_0'^2 + y_0'^2)} \, r_a(z) \sin\left(\theta_a(z) + \arctan\left(\frac{y_0'}{x_0'}\right)\right)$$

Here, the initial conditions are $$r_a(z_O)=\theta_a(z_O)=\theta_b(z_O)=0, \text{ and } r_b(z_O)=1.$$

The charge-density distribution $\rho(x,y,z)$, created by CPB illumination of a subfield of the reticle at a point $(x,y)$ lying in a plane perpendicular to the optical axis at a point z located on the optical axis within the projection-optical system, can be expressed by adding the trajectories for various changes in the initial conditions $(x_0, y_0)$, $(x_0', y_0')$ at the reticle surface $(z=z_o)$. Accordingly, the charge distribution can be computed by the following:

$$\rho(x, y, z) = k * 1/(r_a(z) \cdot r_b * (z))^2 *$$

$$\left( \iint_{X^2+Y^2 \leq r_1^2} \exp\left(-\frac{X^2 + Y^2}{a^2 * r_2^2}\right) dX \, dY \right)^{-1} *$$

$$\iint_{(x-x_1)^2+(y-y_1)^2 \leq (r_a(z)*r_1)^2} P_a((x_1 * \cos\theta_b(z) + y_1 *$$

$$\sin\theta_b(z))/r_b(z), \, (y_1 * \cos\theta_b(z) - x_1 * \sin\theta_b(z))/r_b(z)) *$$

$$\exp\left(-\frac{(x-x_1)^2 + (y-y_1)^2}{a^2 * r_2^2 * r_a(z)^2}\right) dx_1 \, dy_1$$

A truncated Gaussian function was assumed for the angular distribution function $A(x,y,z)$. Here, $r_1$ is a parameter expressing the radius at which the angular distribution is truncated, $r_2$ is a parameter expressing the half bandwidth of the Gaussian distribution, $a=1/(\ln 2)^{1/2}$, and k is the beam charge density of the illumination beam upstream of the reticle. The beam charge density k can be calculated from the ratio of the illumination-beam current to the velocity of the illumination beam. As an alternative to a Gaussian distribution, the angular distribution of the general function $A(x,y,z)$ can be expressed by the following:

$\rho(x, y, z) = k*(1/r_b(z))^2$ $*(\int\int A(X, Y, z)dXdY)^{-1} * \int\int P_a$ $((x_1 *\cos\theta_b(z) + y_1$ $*\sin\theta_b(z))/r_b(z), (y_1$ $*\cos\theta_b(z) - x_1 *\sin\theta_b$ $(z))/r_b(z)) *A$ $(x-x_1, y-y_1, z)dx_1 dy_1$ Next, the electrostatic potential created by the charged particle beam is computed from the charge-density distribution $\rho(x,y,z)$. The electrostatic potential $\Phi(x,y,z)$ can be computed using the following equation:

$$\Phi(x, y, z) = \frac{1}{4\pi\varepsilon_0} \int\int\int \frac{\rho(x_1, y_1, z_1)}{\sqrt{(x-x_1)^2 + (y-y_1)^2 + (z-z_1)^2}} dx_1 dy_1 dz_1$$

wherein $\epsilon_o$ is the vacuum permitivity of free space. The electrostatic potential can be obtained by performing an integration in which the charge-density distribution $\rho(x,y,z)$ computed above is substituted. A discussion of electrostatic potential is provided below.

Obtaining electric fields from electrostatic potentials, however, is well-known and hence is not described herein. An electric field can be expressed simply as the space-differentiated electrostatic potential. Accordingly, electrostatic potentials are computed. From such computations, SCE-based aberrations are computed.

The same result can be achieved by computing electric fields instead of electrostatic potentials, followed by computing SCE-based aberrations from the electric fields. That is, the following description may be understood equally well by using electric fields instead of electrostatic potentials, and by setting up the same kinds of equations to perform computations of SCE-based aberrations.

Next, the effect of electrostatic potential on beam trajectory is computed. The subject electrostatic potential is one that produces the space-charge effect. One method of computing the SCE-related effects on beam trajectory is to add the electrostatic potential $\Phi(x,y,z)$ created by the beam to the electrostatic potential of the lens system, and recompute the beam trajectory from the resulting electrostatic potential. This can be done by adding the electrostatic potential of the foregoing "electrostatic potential from the space-charge effect" to the electrostatic potential used in the trajectory equations, then performing the trajectory computation again. A second method is to compute, from the electrostatic potential $\Phi(x,y,z)$ created by the charged particle beam, the deviation of the trajectory from what it otherwise would be based strictly on the electric and magnetic fields of the lens system, using a near-axis expansion method.

This second method is the easier of the two because it achieves a direct determination of SCE-based aberrations. In an example of a representative computation procedure in this regard, the charge-density distribution $\rho(x,y,z)$ created by the charged particle beam is expressed in cylindrical coordinates $(r,\theta,z)$. The equations for converting from rectangular coordinates are $x=r\cos\theta$, $y=r\sin\theta$, and $z=z$. Next, the charge distribution is expanded by $\theta$ in a Fourier expansion, as noted below:

$$\rho_0(r, z) = \frac{1}{2\pi} \int_0^{2\pi} \rho(r, \theta, z) d\theta$$

$$\rho_m^c(r, z) = \frac{1}{\pi} \int_0^{2\pi} \rho(r, \theta, z)\cos(m\theta) d\theta$$

$$\rho_m^s(r, z) = \frac{1}{\pi} \int_0^{2\pi} \rho(r, \theta, z)\sin(m\theta) d\theta$$

$$\rho(x, y, z) = \sum_{\substack{m=0 \\ n=0}}^{\infty} (\rho_{mn}^c(z) r^n \cos(m\theta) + \rho_{mn}^s(z) r^n \sin(m\theta))$$

wherein m and n are integers (m, n=1, 2, 3 ...). From these Fourier components, expansion components of the electrostatic potential are found. The electrostatic potential is expanded according to the following:

$$\Phi(x, y, z) = \sum_{\substack{m=0 \\ n=0}}^{\infty} (\phi_{mn}^c(z) r^n \cos(m\theta) + \phi_{mn}^s(z) r^n \sin(m\theta))$$

Here, if $z=z_o$ is the object plane (i.e., the plane of the reticle), and $z=z_i$ is the Gaussian image plane (i.e., the plane of the substrate), then the diagonal terms (m=n terms) can be computed as shown below:

$$\phi_{00}^c(z) = \left(\frac{1}{4\pi\varepsilon_0}\right) \frac{1}{2} \int_{z_o}^{z_i} dz' \int_0^{\infty} \frac{r' dr'}{\sqrt{(z-z')^2 + r'^2}} \rho_0(r', z')$$

$$\phi_{00}^s(z) = 0$$

$$\phi_{11}^c(z) = \left(\frac{1}{4\pi\varepsilon_0}\right) \frac{1}{4} \int_{z_o}^{z_i} dz' \int_0^{\infty} \frac{r' dr'}{\sqrt{((z-z')^2 + r'^2)^{3/2}}} \rho_1^c(r', z') r'$$

$$\phi_{11}^s(z) = \left(\frac{1}{4\pi\varepsilon_0}\right) \frac{1}{4} \int_{z_o}^{z_i} dz' \int_0^{\infty} \frac{r' dr'}{\sqrt{((z-z')^2 + r'^2)^{3/2}}} \rho_1^s(r', z') r'$$

$$\phi_{22}^c(z) = \left(\frac{1}{4\pi\varepsilon_0}\right) \frac{3}{16} \int_{z_o}^{z_i} dz' \int_0^{\infty} \frac{r' dr'}{\sqrt{((z-z')^2 + r'^2)^{5/2}}} \rho_2^c(r', z') r'^2$$

-continued $$\phi_{22}^s(z) = \left(\frac{1}{4\pi\varepsilon_0}\right)\frac{3}{16}\int_{z_o}^{z_i} dz' \int_0^\infty \frac{r' dr'}{\sqrt{((z-z')^2+r'^2)^{5/2}}} \rho_2^s(r', z') r'^2$$

Similarly, the non-diagonal terms (i.e., the m n terms) can be computed as indicated below:

$$\phi_{01}^c(z) = \phi_{01}^s(z) = \phi_{10}^c(z) = \phi_{10}^s(z) = 0$$

$$\phi_{02}^c(z) = -\frac{1}{4}\left(\phi_{00}^{c\prime\prime}(z) + \frac{\rho_{00}^c(z)}{\varepsilon_0}\right)$$

$$\phi_{02}^s(z) = \phi_{20}^c(z) = \phi_{20}^s(z) = 0$$

$$\phi_{12}^c(z) = \phi_{21}^c(z) = \phi_{12}^s(z) = \phi_{21}^s(z) = 0$$

Since especially high-order terms are not required, the calculation can be stopped at this point. Equations for computing higher-order terms can be provided, however, and associated computations readily performed.

To simplify calculations, the electrostatic potentials and charge-distribution density can be rewritten in complex form:

$$\phi_0(z) = \phi_{00}^c(z)$$

$$\phi_{11}(z) = \phi_{11}^c(z) + i*\phi_{11}^s(z)$$

$$\phi_{22}(z) = \phi_{22}^c(z) + i*\phi_{22}^s(z)$$

$$\phi_{02}(z) = \phi_{02}^c(z) = -1/4*\left(\phi_0''(z) + \frac{\rho_0(z)}{\varepsilon_0}\right)$$

$$\rho_{11}(z) = \rho_{11}^c(z) + i\cdot\rho_{11}^s(z)$$

$$\rho_0(z) = \rho_{00}^c(z)$$

Next, the effects of the electrostatic potentials on beam trajectory are computed. The main effects are in the linear magnitudes of focus variance, magnification variance, rotation variance, positional variance, astigmatism, orthogonality, and anisotropic magnification.

Variances in focus, magnification, and rotation are dependent on $\phi_o(z)$, which is computed from the following:

$$\delta w_1^{(S)}(z_i) = $$

$$w_b(z_i)\cdot\int_{z_o}^{z_i}\left[\left(\frac{\tau'(z)+\phi_0'(z)}{2(\tau(z)+\phi_0(z))}w'(z)+\frac{\tau''(z)+\phi_0''(z)+\frac{\rho_0(z)}{\varepsilon_0}}{4(\tau(z)+\phi_0(z))}w(z)-i\right.\right.$$

$$\sqrt{\frac{\eta}{2(\tau(z)+\phi_0(z))}}\cdot\left(B(z)w'(z)+\frac{1}{2}B'(z)w(z)\right)\right)\cdot$$

$$\overline{w}_a(z)\cdot\sqrt{\frac{\tau(z)+\phi_0(z)}{\tau(z_0)+\phi_0(z_0)}} -$$

$$\left(\frac{\tau'(z)}{2\tau(z)}w'(z)+\frac{\tau''(z)}{4\tau(z)}w(z)-i\sqrt{\frac{\eta}{2\tau(z)}}\left(B(z)w'(z)+\frac{1}{2}B'(z)w(z)\right)\right)$$

$$\left.\overline{w}_a(z)\cdot\sqrt{\frac{\tau(z)}{\tau(z_0)}}\right] dz$$

wherein $\tau(z)$ is the sum of the lens electrostatic potential and the electrostatic potential that expresses the acceleration voltage of the illumination beam. (The $z_i$ term is the axial coordinate of the image plane (substrate plane); $z_o$ is the axial coordinate of the object (reticle or mask; and $z_{co}$ is the axial coordinate of the contrast-aperture plane). Accordingly, the correction lenses must make corrections to focus, magnification, and rotation so as to cancel these variances in focus, magnification, and rotation.

Depending on the pattern-element distribution, there also may be cases in which the $\phi_{11}(z)$ component of the self-generated electrostatic potential cannot be ignored. The $\phi_{11}(z)$ component is a component of the electrostatic potential that causes a minute amount of deflection of the charged particle beam. The magnitude of this deflection, $\delta w^{(s)}{}_0(z_i)$, at the surface of the sensitive substrate is computed according to the following equation:

$$\delta w_0^{(S)}(z_i) = \frac{1}{2\sqrt{\tau(z_0)}}w_b(z_i)\int_{z_o}^{z_i}\phi_{11}(z)\overline{w}_a(z)\frac{1}{\sqrt{\tau(z)+\phi_0(z)}}dz$$

Hence, the deflectors must apply a reverse correction to cancel this deflection.

In addition, there also may be cases, depending on pattern-element distribution, in which the $\phi_{22}(z)$ component of the self-generated electrostatic potential cannot be ignored. The $\phi_{22}(z)$ component is the component of the electrostatic potential that causes astigmatism. Slight amounts of astigmatism, orthogonality distortions, and anisotropic distortions in the transferred image of the reticle pattern may arise from the $\phi_{22}(z)$ component. The magnitude of this aberration, $\delta w^{(s)}{}_1(z_i)$, at the surface of the sensitive substrate is given by the following:

$$\delta w_1^{(S)}(z_i) = \frac{1}{\sqrt{\tau(z_0)}}w_b(z_i)\int_{z_o}^{z_i}\phi_{22}(z)\overline{w}_a(z)\overline{w}(z)\frac{1}{\sqrt{\tau(z)+\phi_0(z)}}dz$$

Astigmatism, orthogonality, and anisotropic magnification must be corrected by the stigmators applying corrections that will cancel these computed aberrations.

Next, third-order aberrations of the beam trajectory by this electrostatic potential are computed. First, aberration caused by the magnetic and electric fields of the lenses, for which space-charge effects are not included in the computations, are given by the following:

$$\delta w_3^{(G)}(z_i) = \frac{1}{\sqrt{\tau(z_0)}}w_b(z_i)\cdot\int_{z_o}^{z_i}\left[\sqrt{\tau(z)}\left(\overline{w}_a'(z)w'(z)+\frac{\tau''(z)}{4\tau(z)}\overline{w}_a(z)w(z)\right)*\right.$$

$$\left(\frac{1}{2}\overline{w}'(z)w'(z)+\frac{\tau''(z)}{8\tau(z)}\overline{w}(z)w(z)\right)-(\tau(z))^{\frac{1}{2}}\overline{w}_a(z)\frac{\tau''''(z)}{32\tau(z)}w^2(z)\overline{w}(z)+$$

$$\left.\sqrt{\frac{\eta}{2}}\overline{w}_a(z)\left(\frac{i*B''(z)}{4}w(z)w'(z)\overline{w}(z)+\frac{i*B'''(z)}{16}w^2(z)\overline{w}(z)\right)\right]dz$$

To add the self-generated electric field due to the space-charge effect, the self-generated electrostatic potential $\phi_o(z)$ is added to the sum of the electrostatic potential of the lens and the electrostatic potential expressed by the illumination-beam acceleration voltage $\tau(z)$, and the aberration-computation integration is performed, as indicated in the following equation:

$$\delta w_3^{(G+S)}(z_i) = \frac{1}{(\tau(z_0) + \phi_0(z_0))^{\frac{1}{2}}} w_b(z_i)$$

$$\int_{z_0}^{z_i} \left[ \sqrt{\tau(z) + \phi_0(z)} \left( \overline{w}_a'(z) w'(z) + \frac{\tau''(z) + \phi_0''(z) + \frac{\rho_0(z)}{\varepsilon_0}}{4(\tau(z) + \phi_0(z))} \right. \right.$$

$$\left. \overline{w}_a(z) w(z) + \frac{\phi_{11}(z) \cdot \overline{w}_a(z)}{2(\tau(z) + \phi_0(z))} \right) \cdot$$

$$\left( \frac{1}{2} \overline{w}'(z) w'(z) + \frac{\tau''(z) + \phi_0''(z) + \frac{\rho_0(z)}{\varepsilon_0}}{8(\tau(z) + \phi_0(z))} \overline{w}(z) w(z) + \right.$$

$$\frac{\phi_{11}(z) \cdot \overline{w}(z)}{4(\tau(z) + \phi_0(z))} + \frac{\overline{\phi}_{11}(z) \cdot w(z)}{4(\tau(z) + \phi_0(z))} \right) -$$

$$(\tau(z) + \phi_0(z))^{\frac{1}{2}} \overline{w}_a(z) \left( \frac{\tau''''(z) + \phi_0''''(z) + \frac{\rho_0''(z)}{\varepsilon_0} - 4\frac{\rho_{02}(z)}{\varepsilon_0}}{32(\tau(z) + \phi_0(z))} \right.$$

$$w^2(z)\overline{w}(z) + \frac{\left( \phi_{11}''(z) + \frac{\rho_{11}(z)}{\varepsilon_0} \right) \cdot \overline{w}(z) \cdot w(z)}{8(\tau(z) + \phi_0(z))} +$$

$$\left. \frac{\left( \overline{\phi}_{11}''(z) + \frac{\overline{\rho}_{11}(z)}{\varepsilon_0} \right) \cdot w^2(z)}{16(\tau(z) + \phi_0(z))} \right) +$$

$$\sqrt{\frac{\eta}{2}} \overline{w}_a(z) \left( \frac{i \cdot B''(z)}{4} w(z) w'(z) \overline{w}(z) + \frac{i \cdot B'''(z)}{16} w^2(z) \overline{w}(z) \right) \right]$$

$$dz \; \rho_{02}(z) = \rho_{02}^c(z)$$

Although, in the foregoing equation, a fourth-order differential term of electrostatic potential has emerged, whenever the numerical computations do not have fourth-order differential precision, this can be dropped down to a second-order differential by partial differentiation. In addition, by application of the near-axis trajectory equation discussed above, the differential order of the trajectory, w(z), also can be reduced. This can be advantageous in terms of improving the accuracy of the numerical computations. To extract the aberration $(W_3^{(S)}(z_i))$ due to space-charge effects only, the geometric aberration $W_3^{(G)}(z_i)$ can be subtracted from $W_3^{(G+S)}(z_i)$, the integral of the geometric aberration and SCE aberration:

$$\delta w_3^{(S)}(z_i) = \delta w_3^{(G+S)}(z_i) - \delta w_3^{(G)}(z_i)$$

Also, generally, $\tau(z)$, the sum of the electrostatic potential due to the lens field and the electrostatic potential that expresses the illumination-beam acceleration voltage, is generally much larger than the electrostatic potentials due to space-charge effects $\phi_o(z)/\tau(z)$ and $\phi_{m\,m}(z)$. Accordingly, the equation can be simplified by making this assumption in the foregoing integral equation, expanding by $\phi_o(z)/\tau(z)$ and $\phi_m$ $_m(z)/\tau(z)$, and using the equation to the first order. There are cases in which this method will provide sufficiently accurate computations.

Next, a substitution is made for the solution of w(z) (wherein $w(z)=w_x(z)+i\cdot w_y(z)$) in the near-axis trajectory equation on the right side of the foregoing integration equation for first- and third-order aberrations due to the space-charge effect. The following is substituted:

$$w(z)=A\cdot w_a(z)+B\cdot w_b(z)$$

Here, the parameters A and B are complex expressions of the charged-particle point of emergence $(x_0,y_o)$ and angle of emergence $(x_0',y_o')$, respectively, at the surface of the reticle (z=electrostatic charged-particle initial conditions), having the function:

$$A=x_o'+i\cdot y_o'$$

$$B=x_o+i\cdot y_o$$

The trajectory is according to the functions:

$$W_a(z)=r_a(z)\cdot\exp(i\cdot\Theta_a(z))$$

$$W_b(z)=r_b(z)\cdot\exp(i\cdot\Theta_b(z))$$

The aberrations can be isolated and solved for by substituting these functions in the right side of the aberration integration and expanding it with respect to the parameters A and B. The space-charge effect now can be corrected by making corrections using the CPB-correction-optical system to minimize these third-order aberrations.

As for minimizing third-order aberrations, in the case of pincushion distortion (which actually accounts for almost all of the SCE-related distortion within a transfer subfield), for example, the effects of distortion can be alleviated by setting the correction for just the right amount when the making magnification correction (i.e., by setting it midway between the pushed-out and pulled-in locations). Curvature of field aberration within the transfer subfield similarly can be alleviated using this approach (in this instance, by adjusting the focus to midrange). Accordingly, when determining amounts of correction for magnification, focus, etc., it is desirable to compute amounts of aberration not only for changes in magnification due to space-charge effects, but also for third-order (higher-order) pincushion distortion and curvature of the subfield image plane, and to adjust each of these with respect to the other so as to determine the magnification and focus corrections that will provide the least (optimum) distortion and blurring.

In addition to computing values that will enable the correction optics to effect perfect corrections for magnification, focal point, uniformity of astigmatism, positional displacement, orthogonality, and anisotropic magnification (first-order values), it is preferable also to compute the magnitudes of third-order SCE aberrations. Even if the magnitudes of these third-order aberrations cannot be corrected entirely by the CPB-correction-optical system, it is sufficient to reduce them to a point where they do not affect exposure. Of course, for space-charge-related effects occurring at exposure, these measures can be used in conjunction with distortion masks, as discussed above, to ensure that such effects do not occur.

Also, for performing the computations presented above, the equations can be rewritten in numerical computation software, and the actual numerical computations performed by computer.

Similarly,.the present invention can be extended to systems in which an electron beam is deflected by a deflector.

To simplify the description, the above computations were performed based on a non-relativistic approach. However, for a microlithography system using an electron beam, with an acceleration voltage on the order of 100 KeV, it is important for highly accurate computations that relativistic effects be incorporated. Relativity may be introduced by incorporating relativistic effects in computations for solving trajectory equations. The trajectory equation is derived by combining the principle of conservation of energy with an equation of motion. A relativistic trajectory equation can be derived, then, by using a relativistic energy-conservation principle and a relativistic equation of motion for this energy-conservation principle and equation of motion. By making the above computations using a relativistic trajectory equation derived in this manner, high-accuracy corrections can be performed even in electron-beam systems using a high acceleration voltage.

Recently, reticle resizing (which includes reshaping of individual pattern elements) has been proposed for correction of proximity effects in electron-beam microlithography. For greater accuracy in computing corrections for space-charge effects, the computations desirably are performed for the distribution of pattern elements that will exist after any such reticle resizing (to correct for proximity effects) has been performed.

In the discussions herein, the term 'wafer' is used for resist-coated wafers (sensitive substrates) as well as for wafers with no resist.

Figure 13:
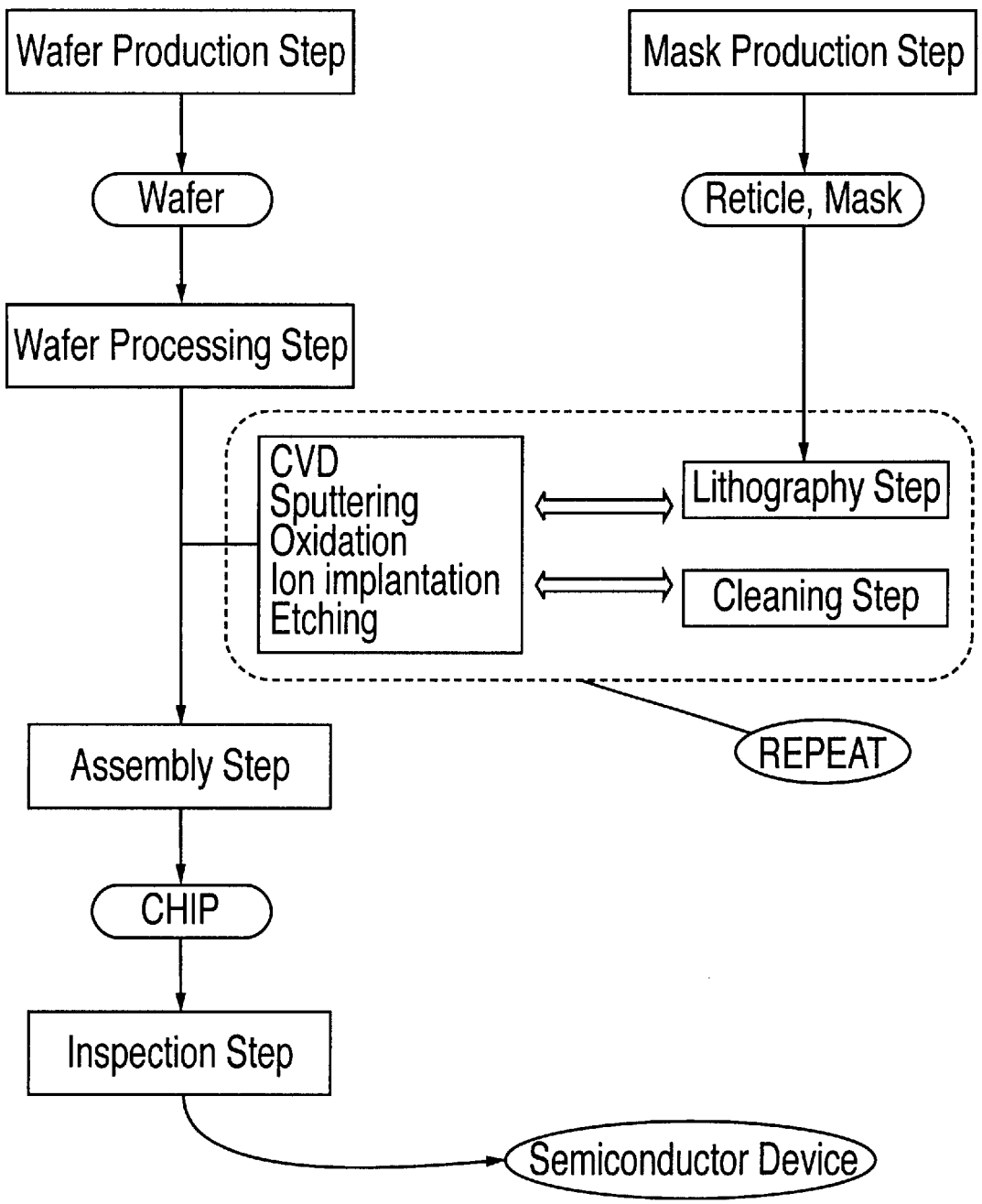
FIG. 13 is a process flowchart for manufacturing a semiconductor device, wherein the process includes a microlithography method according to the invention.

FIG. 13 is a flowchart of an exemplary semiconductor fabrication method to which apparatus and methods according to the invention can be applied readily. The fabrication method generally comprises the main steps of wafer production (wafer preparation), reticle production (reticle preparation), wafer processing, chip assembly (device dicing and assembly to render the devices operational), and inspection of finished chips. Each step usually comprises several sub-steps.

Among the main steps, wafer processing is key to achieving the smallest feature sizes (critical dimensions), best inter-layer registration, and device performance. In the wafer-processing step, multiple circuit patterns are layered successively atop one another on the wafer, wherein the formation of each layer typically involves multiple sub-steps. Usually, many operative semiconductor devices are produced on each wafer.

Typical wafer-processing steps include: (1) thin-film formation (e.g., CVD, sputtering, etc.) involving formation of a dielectric layer for electrical insulation or a metal layer for forming interconnecting wires and electrodes; (2) oxidation of the wafer surface or of the thin-film; (3) microlithography to form a resist pattern for selective processing of the thin film or the substrate itself; (4) etching or analogous step to etch the thin film or substrate according to the resist pattern; (5) doping or analogous implantation step as required to implant ions or impurities into the thin film or wafer according to the resist pattern; (6) resist stripping to remove the resist from the wafer; and (7) wafer inspection. Wafer processing is repeated as required (typically many times) to fabricate the desired semiconductor chips on the wafer.

Figure 14:
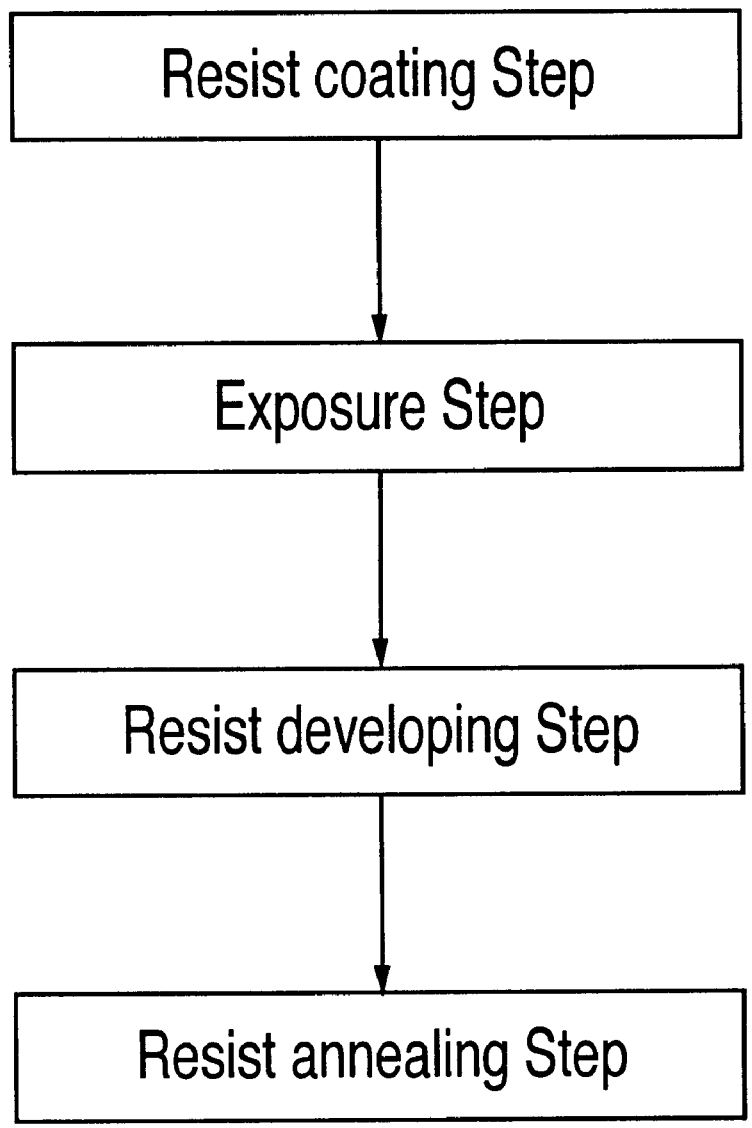
FIG. 14 is a process flowchart for performing a microlithography method that includes a projection-exposure method according to the invention.

FIG. 14 provides a flowchart of typical steps performed in microlithography, which is a principal step in wafer processing. The microlithography step typically includes: (1) a resist-coating step, wherein a suitable resist is coated on the wafer substrate (which can include a circuit element formed in a previous wafer-processing step); (2) an exposure step, to expose the resist with the desired pattern; (3) a development step, to develop the exposed resist; and (4) an optional annealing step, to enhance the durability of the resist pattern.

Use of a CPB microlithography apparatus according to the invention during the exposure step of FIG. 14 provides a substantial improvement in the accuracy of patterns as formed on the wafer by microlithography. It is in the exposure step, in particular, that minimum linewidths and overlay registration accuracy required to support the linewidth are achieved. Thus, the present invention facilitates the manufacture of semiconductor devices that heretofore have been very difficult to manufacture.

In the foregoing discussion, even if correction data are routed to the beam-correction-optical system, the beam-correction-optical system may not correct the image in real time. I.e., there is a delay between the instant that correction data are input and the instant that corrections of SCE-based aberrations according to the data actually are made. To solve this problem, the control computer can be configured to route correction data to the beam-correction-optical system continuously as the illumination beam is scanning a deflection field. During scanning of the illumination beam on the reticle, blur and distortion of the image vary according to the space-charge effect and/or deflection aberrations. Hence, according to the invention, the beam-correction-optical system is driven by changing beam-acceleration voltage and/or beam current in real time, so as to correct the blur and/or distortion in real time. This allows optimal dynamic correction of space-charge-effects at any time during exposure.

To such end, the beam-correction-optical system comprises, for example, one or more of the following: focus lens, stigmator, and deflector. The particular configuration of the beam-correction-optical system should be selected based on the maximal delay time that can be accommodated under the prevailing conditions, i.e., to produce a negligible delay time.

The control computer and/or processors can be configured to deliver correction data to the beam-correction-optical system in a timely manner that takes into consideration any delay time that may be encountered. For example, if the delay time is T and the correction time is t, then correction data should be routed to the beam-correction-optical system no later than t–T.

Alternatively, corrections of SCE-based aberrations can be performed in a discrete manner. I.e., in some instances, it is not necessary that the correction data be changed seamlessly. Thus, "continuously" includes making any interval corrections.

As discussed above, the correction data can be varied corresponding to the distribution of pattern elements within the exposure region. During scanning of the illumination beam, the distribution of pattern elements within the illuminated region is continuously changed. Consequently, SCE-based aberrations change accordingly, requiring corresponding changes in the correction data. Desirably, correction data are changed corresponding to the variations in the distribution of pattern elements. To compute the correction data, a numerical value for the pattern-element distribution is required. Such a numerical value can be calculated from reticle-pattern data organized, for example, in a table or as a function. The computations can be performed by pre-computation or in real time.

The correction data can be calculated using one or more processors, which can greatly facilitate the execution of real-time calculations. Representative processors are digital signal processors.

Controlled changes in operation of the beam-correction-optical system can be performed during "blanking." Blanking is the execution of a blocking deflection of the beam to prevent exposure during a blanking period. Virtually all microlithographic processes require some form of blanking. Real-time corrections require that settling noise of the beam-correction-optical system be kept extremely low, such as when updating beam corrections. Noise in the beam-correction-optical system during updating of correction values causes transfer-image-correction errors. To avoid this problem, correction updating can be performed during times that the beam is blanked. Desirably, beam blanking is performed periodically, wherein the period is no greater than the exposure time. (Of course, blanking time must be much shorter than the time between successive blankings.)

Here, "exposure time" is the time in which the illumination beam scans over a point or pattern element on the reticle. If the time interval between two successive blankings is sufficiently shorter than the exposure time, then some blanking occurs during the exposure time, and the dose is reduced in the exposure region. The reduced dose can be compensated for by increasing the beam intensity, thereby achieving uniform dosing. If the blanking interval is equal to the exposure time, each region experiences one blanking, with a reduced-dose effect as described above. Step time can be varied to compensate for this.

The correction data can be varied corresponding to the position of the illumination beam on the reticle. During scanning of the illumination beam, aberrations including SCE-based aberrations corresponding to beam position vary continuously. Thus, it is desirable that the correction data vary continuously. The correction data can be changed corresponding to the position of the illumination beam on the reticle so as to improve correction accuracy.

Whereas much of the foregoing discussion has been directed to CPB microlithography apparatus employing a single exposure beam, the principles of the invention also are applicable to CPB microlithography apparatus employing multiple exposure beams. The principles of the invention also can be applied to CPB microlithography apparatus employing variable-shaped-beam technology, in which a reticle is not employed at all.

Multiple-beam microlithography apparatus, variable shaped beam microlithography apparatus, and methods to which the principles of this invention can be applied are disclosed, for example, in U.S. Pat. Nos. 5,905,267 and 5,008,553, each of which is incorporated herein by reference. For example, the multiple-beam exposure system of the '267 patent has multiple charged-particle-optical systems (for each beam) such as shown in FIGS. 2 and 3 of that patent. Each charged-particle-optical system includes at least a focus lens, a stigmator, and a deflector. In this context, consider an instance in which a square pattern element is being exposed. During exposure, the pattern feature is blurred and/or distorted due to the space-charge effect. One method in which to correct the space-charge effect is to individually correct the position, focus, and astigmatism of each beam incident to the wafer. If each individual charged-particle optical system has its own deflector, focus lens, and/or stigmator, then each charged-particle optical system can be used for correction of SCE-based aberrations of the respective beam.

By using individual focus lenses in this manner, not only overall focus but also field curvature can be corrected. By using the stigmators in the individual charged-particle optical systems, both overall astigmatism as well as Seidel astigmatism can be corrected. (Seidel astigmatism is not homogeneous within an exposure field, but rather results in astigmatism of different directions and magnitudes to each beam.) Also, deflectors in the individual charged-particle optical systems can be used to correct not only rotation, magnification, orthogonality, and anisotropic magnification of the exposure field, but also to correct non-linear distortions due to the space-charge effect.

If the individual charged-particle optical systems lack SCE-correction capability, an alternative way in which to correct the space-charge effect in such systems is to position a beam-correction-optical system at another location to correct each beam.

By methods and apparatus as described above, patterning accuracy as achieved using multiple charged particle beams can be improved. Of course, similar to CPB microlithography apparatus and methods that employ a reticle, correction values are calculated, for each beam, from the respective beam current, the respective spread-angle distribution of the beam, the respective beam-acceleration voltage to which the beam is subjected, and the respective optical characteristics of the optical system.

Whereas the invention has been described in connection with multiple representative embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A charged-particle-beam microlithography apparatus for transferring a pattern, defined on a reticle segmented into multiple exposure regions, onto a sensitive substrate, the apparatus comprising:

an illumination-optical system situated and configured to direct a charged-particle illumination beam from a source to a selected exposure region on the reticle;

a projection-optical system situated and configured to direct a charged-particle patterned beam, formed by passage of a portion of the illumination beam through the exposure region, from the exposure region onto the sensitive substrate, so as to form a transfer image of the exposure region on a selected corresponding region of the substrate;

a beam-correction-optical system situated and configured to correct the transfer image based on correction data for correcting a space-charge-effect (SCE)-based aberration; and a control computer connected to the beam-correction-optical system, the control computer being configured to control the beam-correction-optical system based on the correction data calculated from a distribution of pattern elements in the exposure region, an illumination-beam current, a spread-angle distribution of the illumination beam, a beam-accelerating voltage to which the illumination beam is subjected, an axial distance between the reticle and the sensitive substrate, and optical characteristics of the projection-optical system.

2. The apparatus of claim 1, wherein:

the pattern as defined on the reticle is divided into multiple subfields each defining a respective portion of the pattern;

the exposure region is substantially coextensive with a subfield; and the control computer is corrected to the illumination-optical system and is configured to cause the illumination beam to illuminate the subfields sequentially and to cause the patterned beam to transfer images of the respective pattern portions defined within the subfields to the sensitive substrate in sequence.

3. The apparatus of claim 1, wherein:

the pattern as defined on the reticle is divided into multiple deflection fields; and the control computer is connected to the illumination-optical system and is configured to cause the illumination beam to scan the deflection fields sequentially and to cause the patterned beam to transfer images of the respective pattern portions defined within the deflection fields to the sensitive substrate in sequence.

4. The apparatus of claim 3, wherein the control computer is configured to route correction data to the beam-correction-optical system continuously as the illumination beam is scanning the deflection fields.

5. The apparatus of claim 4, wherein the correction data are varied corresponding to a distribution of pattern elements in the exposure region.

6. The apparatus of claim 5, further comprising at least one processor, the at least one processor being configured to compute, in real time, the correction data based on the distribution of pattern elements in the exposure region.

7. The apparatus of claim 3, further comprising a blanking deflector situated and configured to deflect the charged particle beam so as to blank the charged particle beam, wherein the at least one processor is further configured to control the beam-correction-optical system so as to change a correction value of beam-acceleration voltage or beam current while the charged particle beam is being blanked.

8. The apparatus of claim 3, wherein the correction data are varied corresponding to a position of the illumination beam on the reticle.

9. The apparatus of claim 1, wherein the beam-correction-optical system is configured to correct at least one of rotation, magnification, focal point, astigmatism, anisotropic magnification, orthogonality, and position of the transfer image.

10. The apparatus of claim 1, wherein the beam-correction-optical system comprises at least three focus-correction lenses, at least two stigmators, and at least one deflector.

11. The apparatus of claim 1, further comprising:
a memory situated and configured to store the correction data; and
a driver connected to the beam-correction-optical system and configured to drive the beam-correction-optical system according to the correction data stored in the memory.

12. In a method for performing charged-particle-beam microlithography in which an exposure region on a divided reticle is illuminated by an illumination beam, and a patterned beam propagating downstream of the illuminated region is imaged by a projection-optical system onto a surface of a sensitive substrate, a method for correcting a space-charge-effect (SCE)-based aberration arising while transferring an image of the illuminated region onto the substrate surface, the method comprising:
(a) providing a calibration pattern;
(b) computing an expected SCE-based aberration expected to occur if the image of the calibration pattern were transferred to the sensitive substrate;
(c) illuminating the calibration pattern with the illumination beam and forming an image of the calibration pattern onto the sensitive substrate or onto a detection mark on a substrate stage;
(d) measuring an actual SCE-based aberration exhibited by the transferred image of the calibration pattern;
(e) computing a correction coefficient for correcting any difference between the expected SCE-based aberration and the actual SCE-based aberration of the transferred image of the calibration pattern;
(f) determining correction data for correcting an SCE-based aberration of a transferred image of an exposure region of a reticle;
(g) calibrating the correction data according to the correction coefficient; and
(h) based on the calibrated correction data, correcting the exposure region and transferring an image of the exposure region to the sensitive substrate.

13. The method of claim wherein step (d) comprises at least one of:
(i) producing an electrical signal from projecting the calibration pattern onto a detection mark provided on the sensitive substrate or on a substrate stage, analyzing the signal with respect to one or more representative points of the calibration pattern; and
(ii) developing the image of the calibration pattern on the substrate, and measuring the image using a measuring instrument.

14. The method of claim 12, wherein step (b) is performed based on a distribution of pattern elements within the calibration pattern, a beam current of the illumination beam, a spread-angle distribution of the illumination beam, an accelerating voltage of the illumination beam, an axial distance from the reticle to the substrate, and optical characteristics of the projection-optical system.

15. The method of claim 12, wherein the computed expected SCE-based aberration and the measured SCE-based aberration comprises at least one of:
image rotation, image magnification, image focal point, image astigmatism, image anisotropic magnification, image orthogonality, and positional displacement of the image.

16. In a method for performing charged-particle-beam (CPB) microlithography in which an exposure region on a divided reticle is illuminated by an illumination charged-particle beam passing through an illumination-optical system, and a patterned charged-particle beam propagating downstream of the illuminated exposure region through a projection-optical system is imaged on a surface of a sensitive substrate, a data-conversion method for converting data used for computing an amount of correction of a space-charge-effect (SCE)-based aberration in an image of the exposure region on the sensitive substrate, the method comprising:
(a) computing the SCE-based aberration from data concerning a distribution of pattern elements within the exposure region, an illumination-beam current with which the exposure region is illuminated, a spread-angle distribution of the illumination beam, an accelerating voltage of the illumination beam, an axial distance from the reticle to the sensitive substrate, and optical characteristics of the projection-optical system; and
(b) producing aberration-correction data from the computed SCE-based aberration.

17. The method of claim 16, wherein step (a) comprises:
computing a distribution of space-charge created by the patterned beam propagating between the reticle and the sensitive substrate;
computing an electrostatic potential created by the distribution of space-charge; and
re-computing a trajectory of the patterned beam, or computing a displacement of the trajectory of the patterned beam, based on the computed electrostatic potential.

18. The method of claim 17, wherein the step of computing the distribution of space-charge comprises the steps:

expressing a spread-angle distribution of the illumination beam as a function A(x,y,z), wherein z is a parameter corresponding to a position on an optical axis of the illumination- and projection-optical systems, and x and y are respective parameters corresponding to respective positions in an xy plane perpendicular to the optical axis;

defining a convolution integral of the spread-angle distribution A(x,y,z) and a distribution $P_a(x,y)$ of pattern elements within the exposure region; and computing discrete values of the space-charge according to the convolution integral, wherein corresponding values of the spread-angle distribution A(x,y,z) are recalled from a look-up table previously stored in a memory, the table containing definite integrals of the x and y parameters of the spread-angle distribution A(x,y,z).

19. The method of claim 17, wherein the step of computing the distribution of space-charge comprises computing a near-axis trajectory of the patterned beam passing through the projection-optical system.

20. The method of claim 16, wherein the distribution of space-charge is computed by:

dividing the exposure region into sub-subfields each including pattern elements;

quantifying one or more characteristics of the pattern elements existing within a sub-subfield;

configuring simplified graphic figures having characteristics corresponding to the quantified characteristics of the pattern elements; and computing the distribution of space-charge based on the simplified graphic figures.

21. The method of claim 20, wherein the characteristics of the pattern elements include at least one of (i) an area of all pattern elements within a sub-subfield, and (ii) a centroid of all pattern elements within the sub-subfield.

22. The method of claim 21, wherein the area and centroid of pattern elements existing within the sub-subfield are determined by:

Area=$\Sigma S_j$

Centroid$_x$=$(\Sigma G_{xj}S_j)/(\Sigma S_j)$

Centroid$_y$=$(\Sigma G_{yj}S_j)/(\Sigma S_j)$, wherein summations ($\Sigma$) are made over all pattern elements existing within the sub-subfield, $S_j$ is an area of a pattern element j existing within the sub-subfield, suffix j is an integer denoting a serial number of pattern elements, and $G_{xj}$ and $G_{yj}$ are x and y coordinates, respectively, of a pattern element j in a plane of the pattern.

23. The method of claim 19, wherein the step of computing the SCE-based aberration comprises the steps:

(i) computing a first-order approximation of the SCE-based aberration in the image of the exposure region, by
(1) computing the electrostatic potential created by the distribution of space-charge, based on a computation of a near-axis trajectory of the patterned beam passing through the projection-optical system; and
(2) recomputing a trajectory of the patterned beam based on the computed electrostatic potential;

(ii) computing a second-order approximation of the SCE-based aberration in the image of the exposure region, by
(1) using the re-computed trajectory of the beam, recomputing the distribution of space-charge created by the patterned beam propagating between the reticle and substrate;
(2) computing the electrostatic potential created by the recomputed distribution of space-charge; and
(3) recomputing the trajectory of the patterned beam based on the computed electrostatic potential; and repeating steps (i) and (ii) as required until a difference between two successive computed approximations is within a prescribed tolerance.

24. The method of claim 16, wherein:

step (a) is performed using a computer system comprising multiple processors; and each processor performs the computation of an SCE-based aberration for a different respective exposure region, the computations performed by the processors being performed in parallel.

25. The method of claim 16, wherein the aberration-correction data comprise a numerical value for at least one of image rotation, image magnification, image focal point, image astigmatism, image anisotropic magnification, image orthogonality, and positional displacement of the image.

26. The method of claim 16, wherein the aberration-correction data include at least one of:

(i) data used for controlling actuation of a CPB-correction-optical system so as to correct the SCE-based aberration; and (ii) data used for altering a position and/or shape of a pattern element defined by the reticle in a manner serving to cancel the SCE-based aberration when the pattern element is imaged onto the substrate.

27. The method of claim 26, wherein the data used for altering a position and/or shape of a pattern element defined by the reticle comprise data for canceling at least one SCE-based aberration selected from the group consisting of image rotation, image magnification, image defocus, image orthogonality, image anisotropic magnification, image position displacement, and higher-order distortion of the image.

28. A charged-particle-beam (CPB) microlithography apparatus, comprising:

a projection-optical system situated and configured to direct a patterned beam from a reticle to a substrate;

a CPB-correction-optical system; and a control computer connected to the CPB-correction-optical system, the control computer being configured to drive the CPB-correction-optical system based on data, to be used by the CPB-correction-optical system, produced by the data-conversion method of claim 26.

29. A reticle for charged-particle-beam (CPB) microlithography, comprising a pattern element having a corrected position or shape according to data produced by the data-conversion method of claim 26.

30. A semiconductor-device fabrication process, comprising the steps of:

(a) preparing a wafer;
(b) processing the wafer; and
(c) assembling devices formed on the wafer during steps (a) and (b), wherein step (b) comprises a method for performing charged-particle-beam microlithography as recited in claim 12.

31. A semiconductor-device fabrication process, comprising the steps of:

(a) preparing a wafer;
(b) processing the wafer; and (c) assembling devices formed on the wafer during steps (a) and (b), wherein step (b) comprises a method for performing charged-particle-beam microlithography as recited in claim 16.

32. A semiconductor-device-fabrication process, comprising the steps of:
   (a) preparing a wafer;
   (b) processing the wafer; and
   (c) assembling devices formed on the wafer during steps (a) and (b), wherein step (b) comprises the steps of
      (i) applying a resist to the wafer;
      (ii) exposing the resist; and
      (iii) developing the resist; and
      step (ii) comprises providing a charged-particle-beam (CPB) microlithography apparatus as recited in claim 1, and using the CPB microlithography apparatus to expose the resist with the pattern defined on the reticle.

33. A semiconductor device produced by the method of claim 30.

34. A semiconductor device produced by the method of claim 31.

35. A semiconductor device produced by the method of claim 32.

36. A charged-particle-beam microlithography apparatus for exposing a sensitive substrate using one or multiple charged particle beams, the apparatus comprising:
   a source configured to produce one or multiple charged particle beams;
   an optical system situated and configured to direct the one or multiple charged particle beams to respective selected exposure regions on the substrate so as to form respective transfer images;
   a beam-correction-optical system situated and configured to apply a correction to the one or multiple charged particle beams based on correction data for correcting a space-charge-effect (SCE)-based aberration; and
   a controller connected to the beam-correction-optical system, the controller being configured to control the beam-correction-optical system based on the correction data which are calculated from beam current, spread-angle distribution, and beam-accelerating voltage of the one or multiple charged particle beams, and from optical characteristics of the optical system.

37. The apparatus of claim 36, wherein the beam-correction-optical system is configured to correct at least one of rotation, magnification, focal point, astigmatism, anisotropic magnification, orthogonality, and position of the respective transfer images.

38. The apparatus of claim 36, wherein the beam-correction-optical system comprises at least three focus-correction lenses, at least two stigmators, and at least one deflector.

39. The apparatus of claim 36, configured to expose the substrate using multiple charged particle beams, wherein:
   the beam-correction-optical system comprises at least one deflector; and
   the at least one deflector corrects a position of each charged particle beam as incident on the substrate, the correction being made independently for each beam based on the correction data.

40. The apparatus of claim 39, wherein:
   the optical system comprises multiple respective charged-particle-optical systems;
   the beam-correction-optical system comprises multiple deflectors each corresponding to a respective charged-particle-optical system; and
   each deflector is situated and configured to correction a position of a respective charged particle beam as incident on the substrate, based on the correction data.

41. The apparatus of claim 36, configured to expose the substrate using multiple charged particle beams, wherein:
   the beam-correction-optical system comprises at least one respective focus lens for each of the charged particle beams;
   the focus lenses correct a focal point of the respective charged particle beam on the substrate independently from each other, based on the correction data.

42. The apparatus of claim 41, wherein:
   the optical system comprises multiple respective charged-particle-optical systems;
   the beam-correction-optical system comprises at least one respective focus lens for each charged-particle-optical systems; and
   each focus lens corrects a focal point of a respective charged particle beam as incident on the substrate, based on the correction data.

43. The apparatus of claim 36, configured to expose the substrate using multiple charged particle beams, wherein:
   the beam-correction-optical system comprises at least one stigmator, the stigmator being situated and configured to correct, for each charged particle beam independently, an astigmatism of each charged particle beam as incident on the substrate, based on the correction data.

44. The apparatus of claim 43, wherein:
   the optical system comprises multiple respective charged-particle-optical systems;
   the beam-correction-optical system comprises at least one stigmator associated with each respective charged-particle-optical system; and each stigmator corrects an astigmatism of the respective charged particle beam as incident on the substrate, based on the correction data.

* * * * *

UNITED STATES PATENT AND TRADEMARK OFFICE
CERTIFICATE OF CORRECTION

PATENT NO. : 6,630,681 B1
DATED : October 7, 2003
INVENTOR(S) : Kojima

It is certified that error appears in the above-identified patent and that said Letters Patent is hereby corrected as shown below:

Title page,
Item [57], ABSTRACT,
Line 2, "space-charged effects" should be -- space-charge effects --.

Column 3,
Lines 29-30, "to correcting" should be -- to correct --.

Column 5,
Lines 36-45, the equation should be expressed as follows:

$$-- \rho(x,y,z) = k * (1/r_b(z))^2 * \left( \iint A(X,Y,z) dXdY \right)^{-1}$$
$$* \iint P_a((x_1 * \cos\theta_b(z) + y_1 * \sin\theta_b(z))/r_b(z), (y_1 * \cos\theta_b(z) - x_1 * \sin\theta_b(z))/r_b(z))$$
$$* A(x - x_1, y - y_1, z) dx_1 dy_1 \; --.$$

Column 8,
Line 21, "by reticle" should be -- by a reticle --.

Column 16,
Lines 11-20, the equation should be expressed as follows:

$$-- \rho(x,y,z) = k * (1/r_b(z))^2 * \left( \iint A(X,Y,z) dXdY \right)^{-1}$$
$$* \iint P_a((x_1 * \cos\theta_b(z) + y_1 * \sin\theta_b(z))/r_b(z), (y_1 * \cos\theta_b(z) - x_1 * \sin\theta_b(z))/r_b(z))$$
$$* A(x - x_1, y - y_1, z) dx_1 dy_1 \; --.$$

Line 58, "at time" should be -- at the time --.

Column 17,
Line 48, "Reference also" should be -- Reference is also --.

Column 18,
Line 35, "FIG. -3" should be -- FIG.-3 --.

Column 20,
Line 2, "computer" should be -- computer 25. --.

UNITED STATES PATENT AND TRADEMARK OFFICE
CERTIFICATE OF CORRECTION

PATENT NO. : 6,630,681 B1
DATED : October 7, 2003
INVENTOR(S) : Kojima

It is certified that error appears in the above-identified patent and that said Letters Patent is hereby corrected as shown below:

Column 22,
Line 39, the equation should be expressed as follows:

$$-- r_a(z_0) = \theta_a(z_0) = \theta_b(z_0) = 0, \text{ and } r_b(z_0) = 1 --.$$

Lines 50-62, the equation should be expressed as follows:

$$-- \rho(x, y, z) = k * 1/(r_a(z) \cdot r_b(z))^2 * \left( \iint_{X^2+Y^2 \leq r_1^2} \exp\left(-\frac{X^2 + Y^2}{a^2 * r_2^2}\right) dX dY \right)^{-1}$$

$$* \iint_{(x-x_1)^2+(y-y_1)^2 \leq (r_a(z)*r_1)^2} P_a\left((x_1 * \cos\theta_b(z) + y_1 * \sin\theta_b(z))/r_b(z), (y_1 * \cos\theta_b(z) - x_1 * \sin\theta_b(z))/r_b(z)\right)$$

$$* \exp\left(-\frac{(x-x_1)^2 + (y-y_1)^2}{a^2 * r_2^2 * r_a(z)^2}\right) dx_1 dy_1 --.$$

Column 23,
Lines 9-19, the equation should be expressed as follows:

$$-- \rho(x, y, z) = k * (1/r_b(z))^2 * \left( \iint A(X, Y, z) dX dY \right)^{-1}$$

$$* \iint P_a\left((x_1 * \cos\theta_b(z) + y_1 * \sin\theta_b(z))/r_b(z), (y_1 * \cos\theta_b(z) - x_1 * \sin\theta_b(z))/r_b(z)\right)$$

$$* A(x - x_1, y - y_1, z) dx_1 dy_1 --.$$

Column 24,
Line 20, "y=rsin θ," should be -- $y = r\sin\theta$, --.

Column 25,
Lines 45-64, the equation should be expressed as follows:

$$-- \delta w_1^{(S)}(z_i) = w_b(z_i)$$

$$\cdot \int_{r_0}^{r_i} \left[ \left( \frac{\tau'(z) + \phi_0'(z)}{2(\tau(z) + \phi_0(z))} w'(z) + \frac{\tau''(z) + \phi_0''(z) + \frac{\rho_0(z)}{\varepsilon_0}}{4(\tau(z) + \phi_0(z))} w(z) - i\sqrt{\frac{\eta}{2(\tau(z) + \phi_0(z))}} \right. \right.$$

$$\left. \cdot \left( B(z)w'(z) + \frac{1}{2}B(z)w'(z) \right) \right) \cdot \overline{w}_a(z) \cdot \sqrt{\frac{\tau(z) + \phi_0(z)}{\tau(z_0) + \phi_0(z_0)}}$$

$$\left. - \left( \frac{\tau'(z)}{2\tau(z)} w'(z) + \frac{\tau''(z)}{4\tau(z)} w(z) - i\sqrt{\frac{\eta}{2\tau(z)}} \left( B(z)w'(z) + \frac{1}{2}B(z)w'(z) \right) \right) \overline{w}_a(z) \cdot \sqrt{\frac{\tau(z)}{\tau(z_0)}} \right] dz --$$

UNITED STATES PATENT AND TRADEMARK OFFICE
CERTIFICATE OF CORRECTION

PATENT NO. : 6,630,681 B1
DATED : October 7, 2003
INVENTOR(S) : Kojima

It is certified that error appears in the above-identified patent and that said Letters Patent is hereby corrected as shown below:

Column 26,
Line 9, "(reticle or mask; and" should be -- (reticle or mask); and --.
Lines 54-60, the equation should be expressed as follows:

$$-- \delta w_3^{(G)}(z_i) = \frac{1}{\sqrt{\tau(z_0)}} w_b(z_i)$$

$$\cdot \int_{z_0}^{z_i} \left[ \sqrt{\tau(z)} \left( \overline{w}_a'(z)w'(z) + \frac{\tau''(z)}{4\tau(z)} \overline{w}_a(z)w(z) \right) \right.$$

$$* \left( \frac{1}{2} \overline{w}'(z)w'(z) + \frac{\tau''(z)}{8\tau(z)} \overline{w}(z)w(z) \right) - (\tau(z))^{1/2} \overline{w}_a(z) \frac{\tau''''(z)}{32\tau(z)} w^2(z)\overline{w}(z)$$

$$\left. + \sqrt{\frac{\eta}{2}} \overline{w}_a(z) \left( \frac{i*B''(z)}{4} w(z)w'(z)\overline{w}(z) + \frac{i*B'''(z)}{16} w^2(z)\overline{w}(z) \right) \right] dz --.$$

Column 27,
Lines 5-41, the equations should be expressed as follows:

$$-- \delta w_3^{(G+S)}(z_i) = \frac{1}{(\tau(z_0) + \phi_0(z_0))^{1/2}} w_b(z_i)$$

$$\int_{z_0}^{z_i} \left[ \sqrt{\tau(z) + \phi_0(z)} \left( \overline{w}_a'(z)w'(z) + \frac{\tau''(z) + \phi_0''(z) + \frac{\rho_0(z)}{\varepsilon_0}}{4(\tau(z) + \phi_0(z))} \overline{w}_a(z)w(z) + \frac{\phi_{11}(z) \cdot \overline{w}_a(z)}{2(\tau(z) + \phi_0(z))} \right) \right.$$

$$\cdot \left( \frac{1}{2} \overline{w}'(z)w'(z) + \frac{\tau''(z) + \phi_0''(z) + \frac{\rho_0(z)}{\varepsilon_0}}{8(\tau(z) + \phi_0(z))} \overline{w}(z)w(z) + \frac{\phi_{11}(z) \cdot \overline{w}(z)}{4(\tau(z) + \phi_0(z))} + \frac{\overline{\phi}_{11}(z) \cdot w(z)}{4(\tau(z) + \phi_0(z))} \right)$$

$$- (\tau(z) + \phi_0(z))^{1/2} \overline{w}_a(z) \left( \frac{\tau''''(z) + \phi_0''''(z) + \frac{\rho_0''(z)}{\varepsilon_0} - 4\frac{\rho_{02}(z)}{\varepsilon_0}}{32(\tau(z) + \phi_0(z))} w^2(z)\overline{w}(z) \right.$$

$$\left. + \frac{\left( \phi_{11}''(z) + \frac{\rho_{11}(z)}{\varepsilon_0} \right) \cdot \overline{w}(z) \cdot w(z)}{8(\tau(z) + \phi_0(z))} + \frac{\left( \overline{\phi}_{11}''(z) + \frac{\overline{\rho}_{11}(z)}{\varepsilon_0} \right) \cdot w^2(z)}{16(\tau(z) + \phi_0(z))} \right)$$

$$\left. + \sqrt{\frac{\eta}{2}} \overline{w}_a(z) \left( \frac{i \cdot B''(z)}{4} w(z)w'(z)\overline{w}(z) + \frac{i \cdot B'''(z)}{16} w^2(z)\overline{w}(z) \right) \right] dz$$

$$\rho_{02}(z) = \rho_{02}^c(z) --.$$

UNITED STATES PATENT AND TRADEMARK OFFICE
CERTIFICATE OF CORRECTION

PATENT NO. : 6,630,681 B1
DATED : October 7, 2003
INVENTOR(S) : Kojima

It is certified that error appears in the above-identified patent and that said Letters Patent is hereby corrected as shown below:

Column 28,
Lines 20-22, the equations should be expressed as follows:

$$-- W_a(z) = r_a(z) \cdot \exp(i \cdot \vartheta_a(z))$$
$$W_b(z) = r_b(z) \cdot \exp(i \cdot \vartheta_b(z)) --.$$

Line 33, "when the making" should be -- when making --.
Line 64, "Similarly., the" should be -- Similarly, the --.

Column 34,
Line 9, "claim wherein" should be -- claim 12, wherein --.

Column 35,
Line 54, "claim 19," should be -- claim 17, --.

Column 38,
Line 16, "correction a" should be -- correct a --.
Line 33, "systems;" should be -- system; --.

Signed and Sealed this

Tenth Day of May, 2005

JON W. DUDAS
*Director of the United States Patent and Trademark Office*